(12) United States Patent
Thei et al.

(10) Patent No.: US 8,349,680 B2
(45) Date of Patent: Jan. 8, 2013

(54) HIGH-K METAL GATE CMOS PATTERNING METHOD

(75) Inventors: Kong-Beng Thei, Hsin-Chu Country (TW); Harry Chuang, Hsin-Chu (TW); Ryan Chia-Jen Chen, Chiayi (TW); Su-Chen Lai, Hsinchu (TW); Yi-Shien Mor, Hsinchu (TW); Yi-Hsing Chen, Changhua (TW); Gary Shen, Yonghe (TW); Yu Chao Lin, Rende Township, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 365 days.

(21) Appl. No.: 12/536,629

(22) Filed: Aug. 6, 2009

(65) Prior Publication Data

US 2010/0048013 A1   Feb. 25, 2010

Related U.S. Application Data

(60) Provisional application No. 61/090,835, filed on Aug. 21, 2008.

(51) Int. Cl.
*H01L 21/8238*   (2006.01)

(52) U.S. Cl. .................. 438/216; 257/E21.637

(58) Field of Classification Search .................. 438/216
See application file for complete search history.

(56) References Cited

U.S. PATENT DOCUMENTS

| | | | |
|---|---|---|---|
| 6,894,353 B2 | 5/2005 | Samavedam et al. | |
| 6,927,135 B2 | 8/2005 | Fishburn et al. | |
| 7,153,784 B2 | 12/2006 | Brask et al. | |
| 7,220,635 B2 | 5/2007 | Brask et al. | |
| 2006/0102963 A1 | 5/2006 | Huang | |
| 2006/0102964 A1 | 5/2006 | Huang | |
| 2006/0166425 A1* | 7/2006 | Triyoso et al. | 438/199 |

* cited by examiner

*Primary Examiner* — Chandra Chaudhari
(74) *Attorney, Agent, or Firm* — Haynes and Boone, LLP

(57) ABSTRACT

The present disclosure provides a method of fabricating a semiconductor device. The method includes providing a semiconductor substrate having a first active region and a second active region, forming a high-k dielectric layer over the semiconductor substrate, forming a capping layer over the high-k dielectric layer, forming a first metal layer over the capping layer, the first metal layer having a first work function, forming a mask layer over the first metal layer in the first active region, removing the first metal layer and at least a portion of the capping layer in the second active region using the mask layer, and forming a second metal layer over the partially removed capping layer in the second active region, the second metal layer having a second work function.

20 Claims, 23 Drawing Sheets

HIGH-K METAL GATE CMOS PATTERNING METHOD

PRIORITY DATA

This application claims priority to Provisional Application Ser. No. 61/090,835, filed on Aug. 21, 2008, entitled "NOVEL HIGH-K METAL GATE CMOS PATTERNING METHOD," the entire disclosure of which is incorporated herein by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow such as patterning to form a dual gate structure for an N-type MOS (NMOS) device P-type MOS (PMOS) device.

Accordingly, what is needed is a new and improved method for high-k metal gate CMOS patterning.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1A:
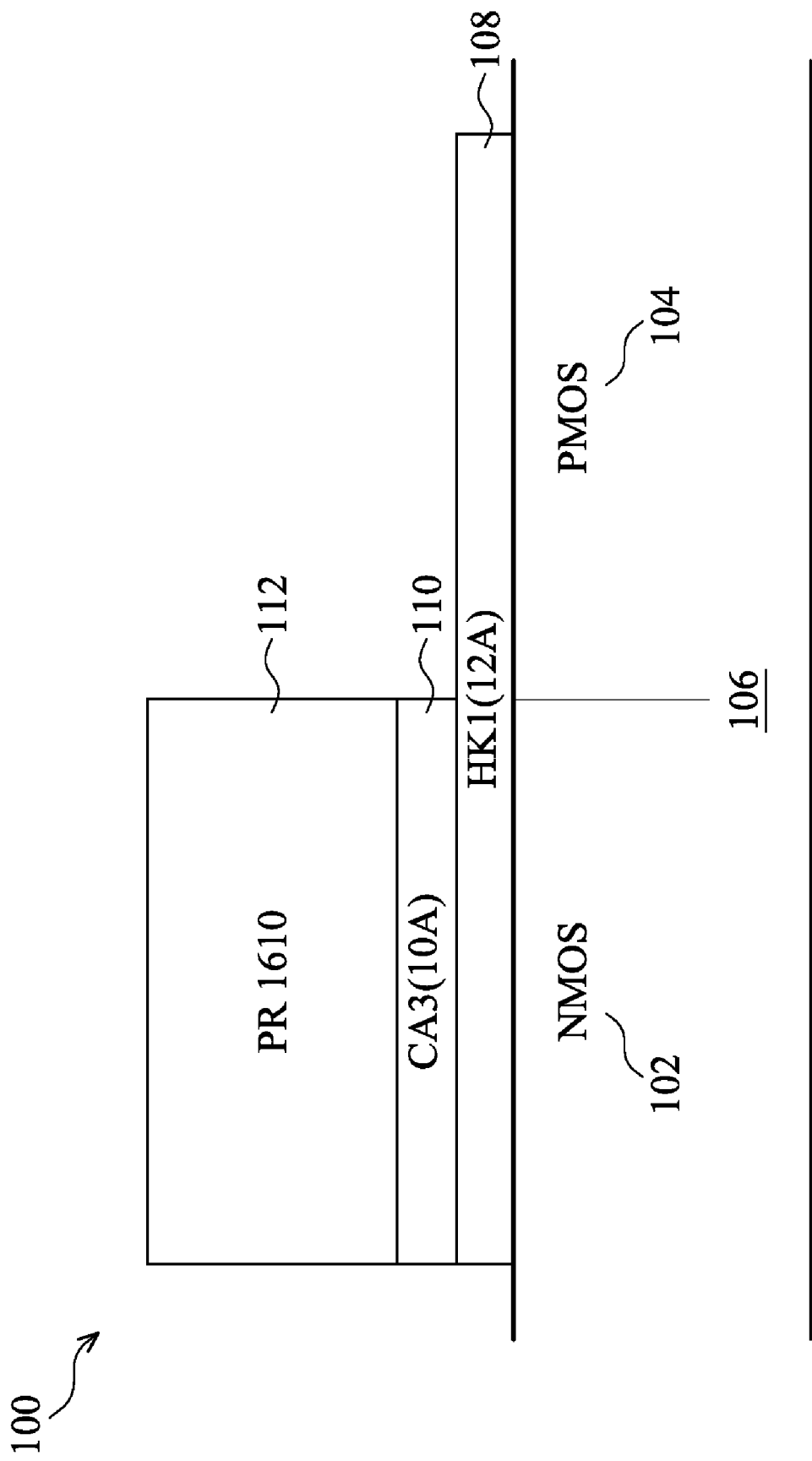
FIGS. 1A and 1B are cross-sectional of a semiconductor device at various stages of fabrication.
Figure 1B:
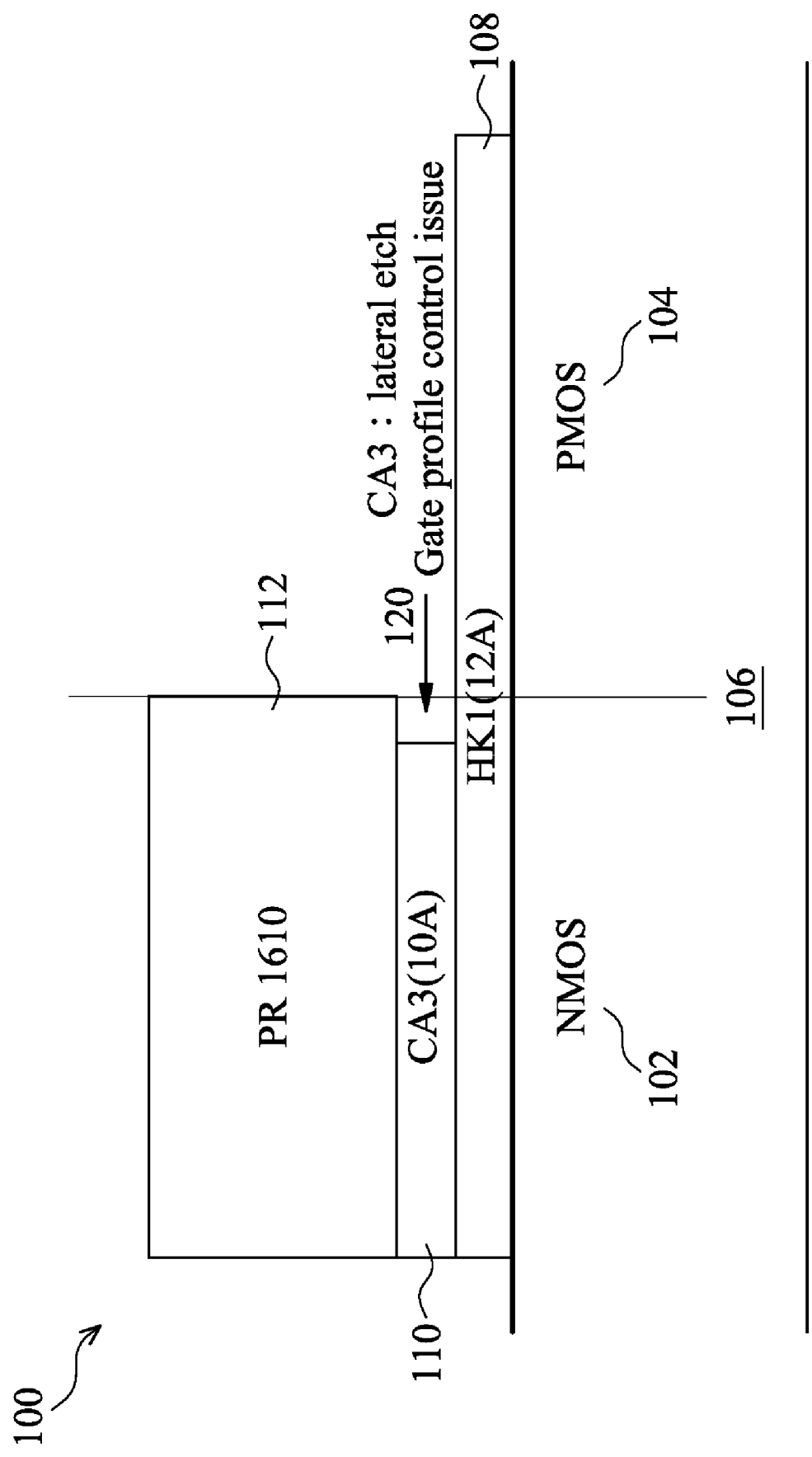

Referring to FIGS. 1A and 1B, illustrated are cross-sectional views of a semiconductor device 100 at various stages of fabrication. It is understood that the semiconductor device 100 may be fabricated with normal CMOS technology processes, and thus some processes are only briefly described herein. In FIG. 1A, the semiconductor device 100 may include an N-type MOS (NMOS) field effect transistor device 102 and a P-type MOS (PMOS) field effect transistor device 104 formed in a semiconductor substrate 106.

The semiconductor device 100 may further include an interfacial layer (not shown) formed over the substrate 106. The interfacial layer may include a silicon oxide layer having a thickness ranging from about 5 to about 10 angstrom (A). The semiconductor device 100 may further include a high-k dielectric layer 108 formed on the interfacial layer. The high-k dielectric layer 108 may be formed by atomic layer deposition (ALD) or other suitable technique. The high-k dielectric layer 108 may include a thickness ranging from about 10 to about 30 angstrom (A). In the present example, the thickness of the high-k dielectric layer 108 may be about 12 angstrom (A). The high-k dielectric layer 108 may include hafnium oxide ($HfO_2$). Alternatively, the high-k dielectric layer 108 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The semiconductor device 100 may further include a capping layer for tuning a work function of a metal layer (for the gate electrode) for properly performing as an NMOS transistor device 102 and a PMOS transistor device 104, respectively. For example, a capping layer 110 such as lanthanum oxide (LaO) may be formed in the NMOS region 102. The capping layer 110 is initially deposited on the high-k dielectric layer 108, and may be patterned a photolithography process known in the art. The capping layer 110 may include a thickness ranging from about 3 to about 20 angstrom (A). In the present example, the thickness of the capping layer is about 10 A. The photolithography process may be performed to form a patterned photoresist layer 112 to protect the capping layer 110 in the NMOS device 102.

In FIG. 1B, a wet etch process may be performed on the capping layer 110 to remove the capping layer in the PMOS device 104. However, it has been observed that during the etch process, there is some lateral etching 120 of the capping layer 110 in the NMOS device 102. In other words, there is some unintended etching of the capping layer 110 underneath the patterned photoresist 112. Thus, the gate profile for the devices becomes more difficult to control which can lead to poor device performance. Further, it has been observed that defects may occur due to the photoresist residue that remains after stripping the patterned photoresist.

Figure 2:
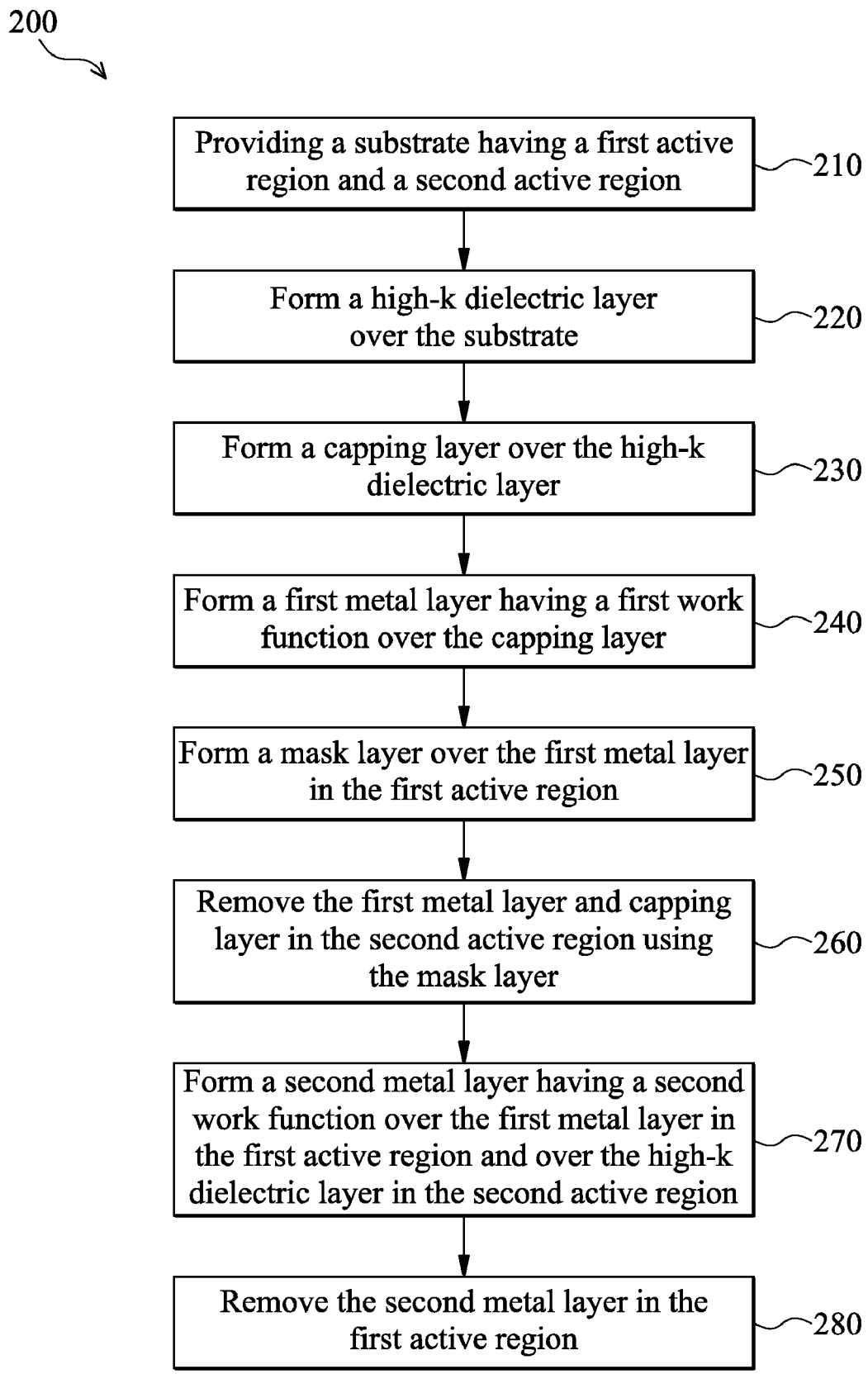
FIG. 2 is a flowchart illustrating a method for fabricating a semiconductor device in a gate first process according to various aspects of the present disclosure.

Referring now to FIG. 2, illustrated is a flowchart of a method 200 for fabricating a semiconductor device in a gate first process according to various aspects of the present disclosure. Referring also to FIGS. 3A to 3D, illustrated are cross-sectional views of a semiconductor at various stages of fabrication according to the method 200 of FIG. 2. It is understood that part of the semiconductor device 300 may be fabricated with normal CMOS technology processing, and thus some processes are only briefly described herein. Also, FIGS. 3A to 3D illustrating the semiconductor device 300 are simplified for a better understanding of the inventive concepts of the present disclosure.

Figure 3A:
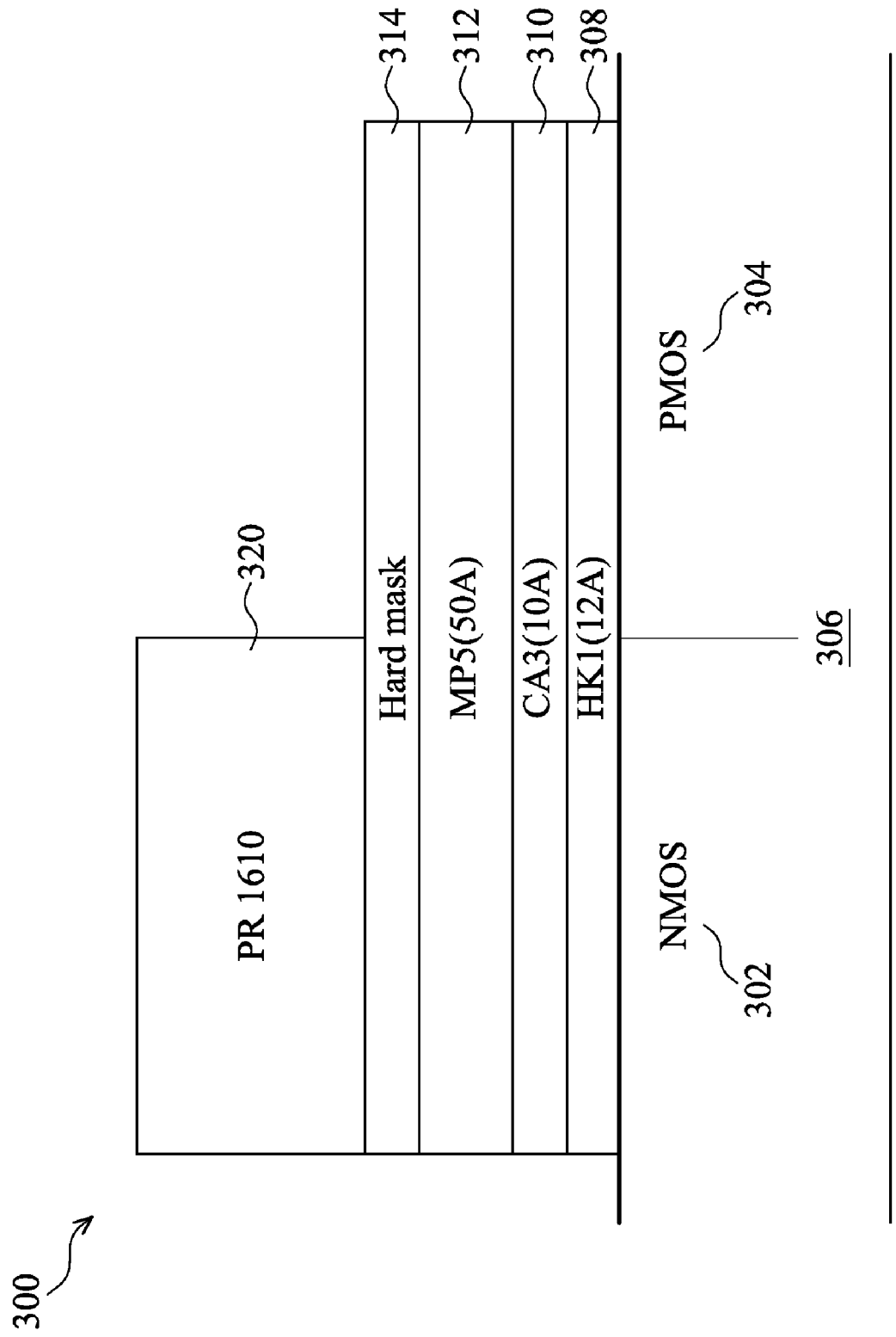
FIGS. 3A to 3D are cross-sectional views of a semiconductor device at various stages of fabrication according to the method of FIG. 2.

The method 200 begins with block 210 in which a semiconductor substrate having a first active region and a second active region may be provided. In FIG. 3A, the semiconductor device 300 may include a region 302 for an NMOS device and a region 304 for a PMOS device. The semiconductor device 300 may include a semiconductor substrate 306 such as a silicon substrate. The substrate 306 may alternatively include silicon germanium, gallium arsenic, or other suitable semiconductor materials. The substrate 306 may further include other features such as various doped regions, a buried layer, and/or an epitaxy layer. Furthermore, the substrate 306 may be a semiconductor on insulator such as silicon on insulator (SOI). In other embodiments, the semiconductor substrate 306 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 300 may further include an isolation structure (not shown) such as a shallow trench isolation (STI) feature formed in the substrate 306 for isolating the NMOS device 302 and PMOS device 304. The isolation structure may be formed of silicon oxide, silicon nitride, silicon oxynitride, fluoride-doped silicate (FSG), and/or a low k dielectric material known in the art.

The method 200 continues with block 220 in which a high-k dielectric layer may be formed over the semiconductor substrate. The semiconductor device 300 may further include an interfacial layer (not shown) formed over the substrate 306. The interfacial layer may include a silicon oxide layer having a thickness ranging from about 5 to about 10 angstrom (A). The semiconductor device 300 may further include a high-k dielectric layer 308 formed on the interfacial layer. The high-k dielectric layer 308 may be formed by atomic layer deposition (ALD) or other suitable technique. The high-k dielectric layer 308 may include a thickness ranging from about 10 to about 30 angstrom (A). The high-k dielectric layer 308 may include hafnium oxide ($HfO_2$). Alternatively, the high-k dielectric layer 308 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 200 continues with block 230 in which a capping layer may be formed over the high-k dielectric layer. The semiconductor device 300 may further include a capping layer for tuning a work function of a metal layer (for the gate electrode) for properly performing as an NMOS transistor device 302 and a PMOS transistor device 304, respectively. For example, a capping layer 310 such as lanthanum oxide may be formed on the high-k dielectric layer 308 by deposition or other suitable process. The capping layer 310 may include a thickness ranging from about 3 to about 20 angstrom (A). Alternatively the capping layer may optionally include LaSiO, manganese oxide, aluminum oxide, or other suitable materials.

The method 200 continues with block 240 in which a first metal layer having a first work function may be formed over the capping layer. The semiconductor device 300 may further include a metal layer 312 formed over the capping layer 310. The metal layer 312 may have a first work function such as an N work function metal (N-metal). For example, the metal layer 312 may include TiN having a thickness ranging from about 10 to about 200 angstrom (A). The TiN metal layer/lanthanum oxide capping layer may perform with an effective work function of an N-metal. The metal layer 312 may be formed by various deposition techniques such as chemical vapor deposition (CVD), physical vapor deposition (PVD or sputtering), plating, or other suitable technique. Alternatively, the metal layer 312 may optionally include TaN, $ZrSi_2$, $MoSi_2$, $TaSi_2$, $NiSi_2$, WN, or other suitable material.

The method 200 continues with block 250 in which a mask layer may be formed over the first metal layer in the first active region. The semiconductor device 300 may further include a hard mask 314 formed over the metal layer 312. The hard mask 314 may be formed by a deposition process or other suitable process. The hard mask 314 may include silicon nitride, silicon oxynitride, silicon carbide, or other suitable material. A patterned photoresist layer 320 may be formed by a photolithography process for N/P patterning. The photolithography process may include spin coating, soft-baking, exposure, post-baking, developing, rinsing, drying, and other suitable process. Alternatively, the patterning may be performed by immersion lithography, electron beam lithography, or other suitable process. The patterned photoresist layer 320 may protect the various layers in the NMOS device 302.

Figure 3B:
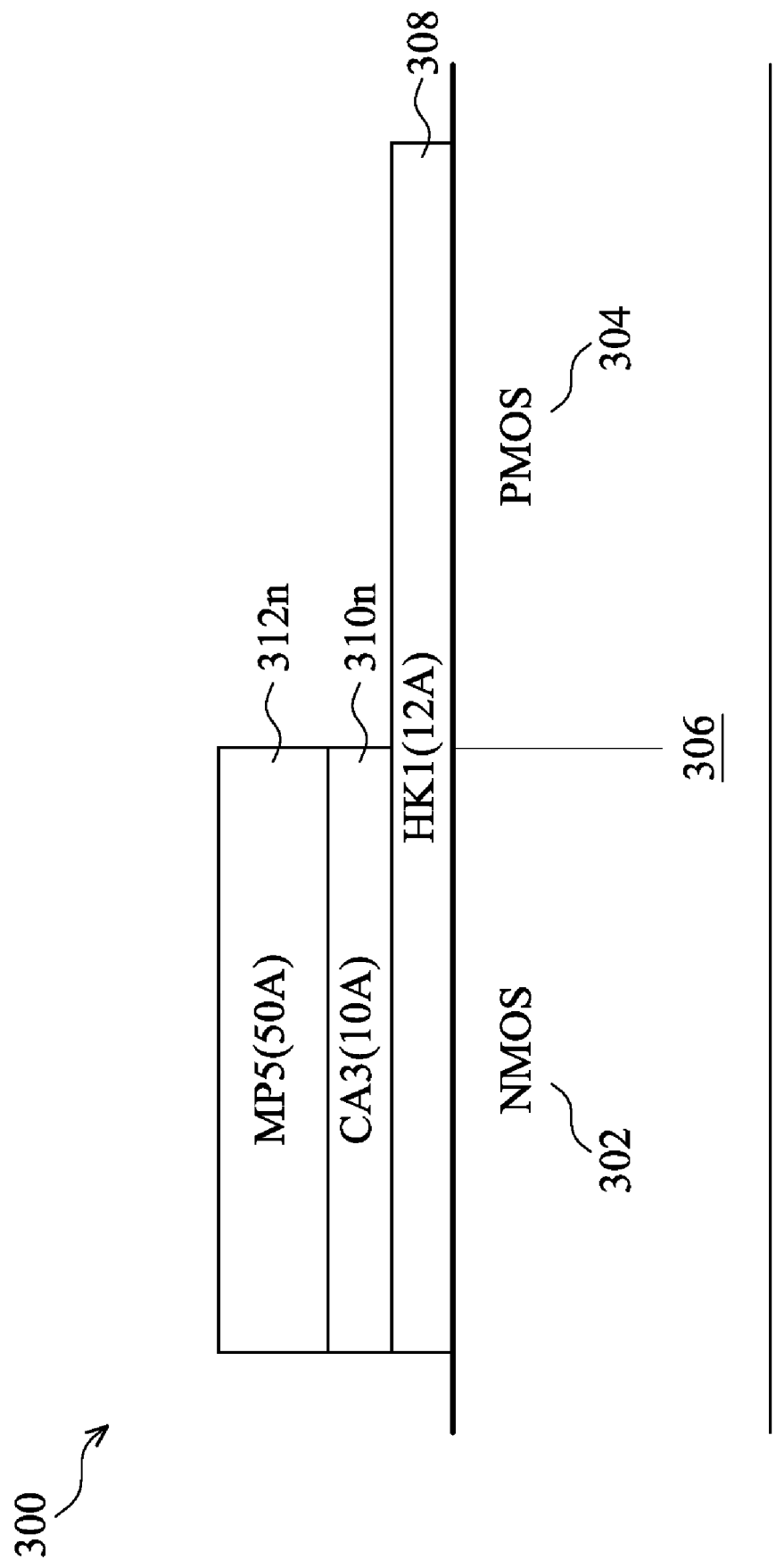
Figure 3C:
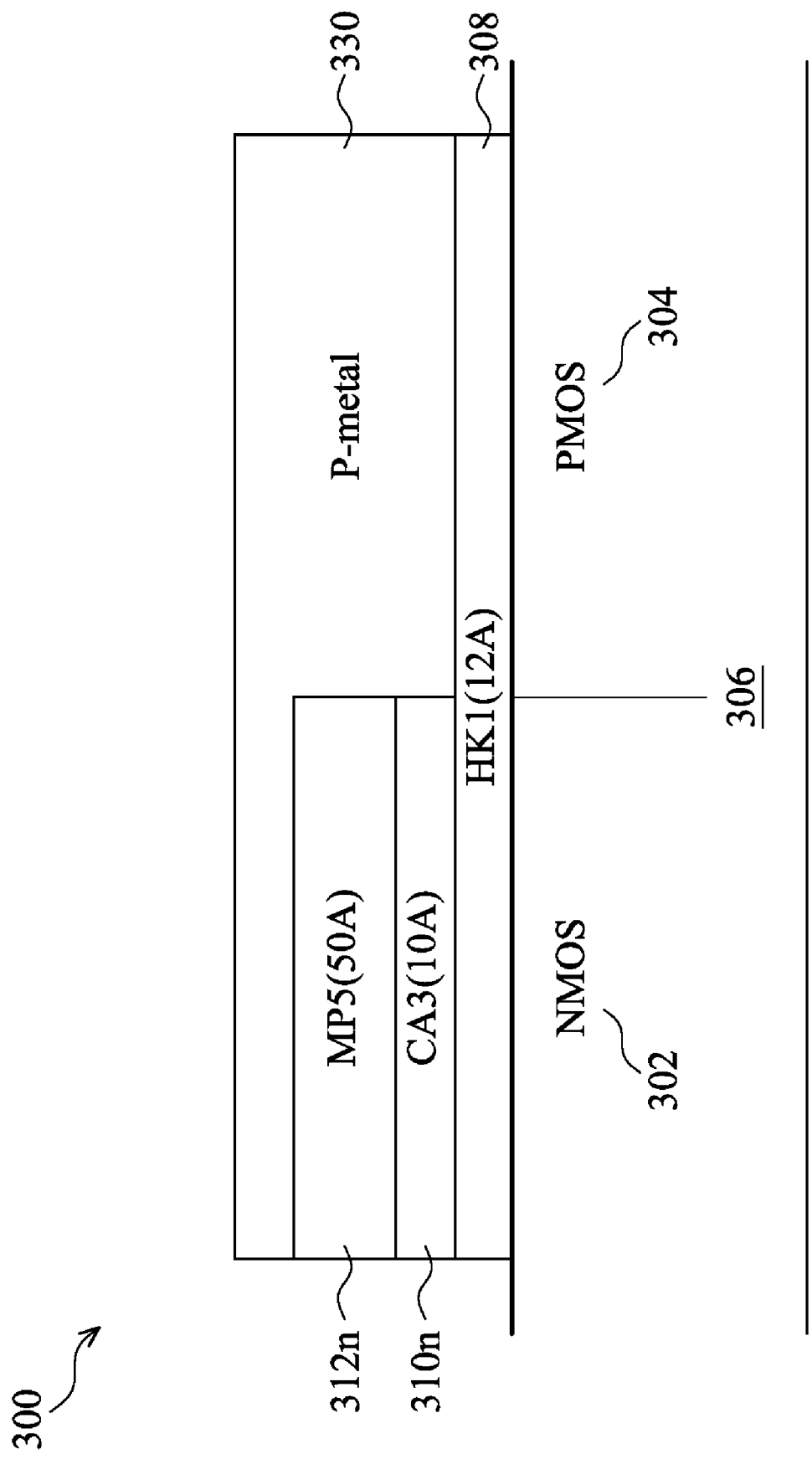

The method 200 continues with block 260 in which the first metal layer and capping layer in the second active region may be removed using the mask layer. In FIG. 3B, an etch process may performed to remove the unprotected portion of the hard mask 314. The etch process may have a high selectivity such that the etch process may stop at the metal layer 312. Another etch process may be performed to remove the unprotected portion of the metal layer 312 and the capping layer 310 in the PMOS device 304 side. Accordingly, a metal layer (e.g., N-metal) 312n and capping layer 310n (tuning the metal layer to perform as N-metal) may remain in the NMOS device 302 side. The method continues with block 260 in which the mask layer may be removed. The patterned photoresist layer 320 and hard mask 314 may be removed by stripping or other suitable process. It should be noted that the metal layer 312 may function as a second hard mask during the removal of the capping layer 310.

The method 200 continues with block 270 in which a second metal layer having a second work function may be formed on the first metal layer in the first active region and on the high-k dielectric layer in the second active region. In FIG.

Figure 3D:
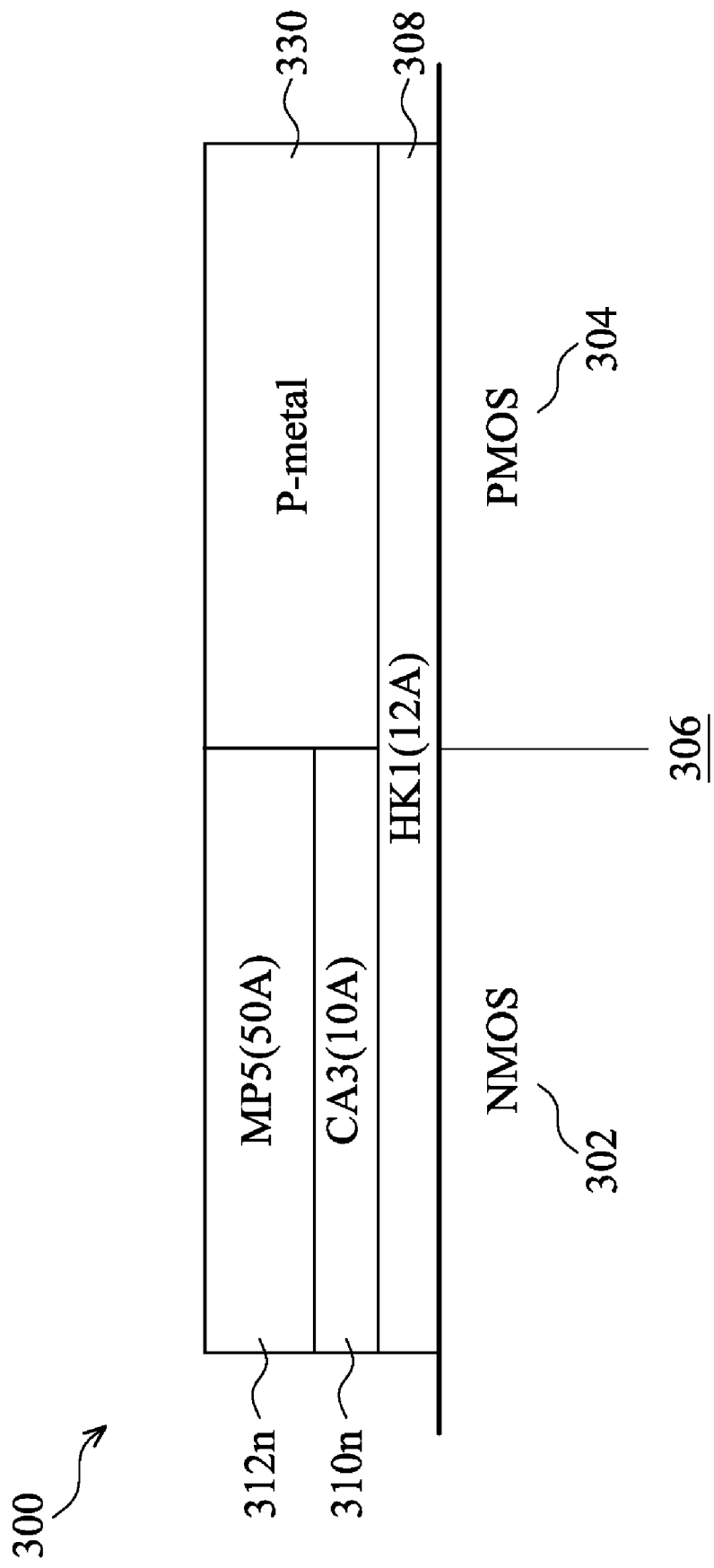

3C, a metal layer 330 having a P work function metal (P-metal) may be deposited on the metal layer 312n in the NMOS device 302, and on the high-k dielectric layer 308 in the PMOS device 304. The metal layer 330 may include TiN and WN, or other suitable metal with a P work function. The method 200 continues with block 280 in which the second metal layer may be removed in the first active region. In FIG. 3D, an etch back process or chemical mechanical polishing (CMP) may be performed on the metal layer 330 to form a dual metal gate structure for the NMOS device 302 and PMOS device 304, respectively. The semiconductor device 300 may subsequently undergo a standard CMOS process flow to complete fabrication of the semiconductor device.

Figure 4:
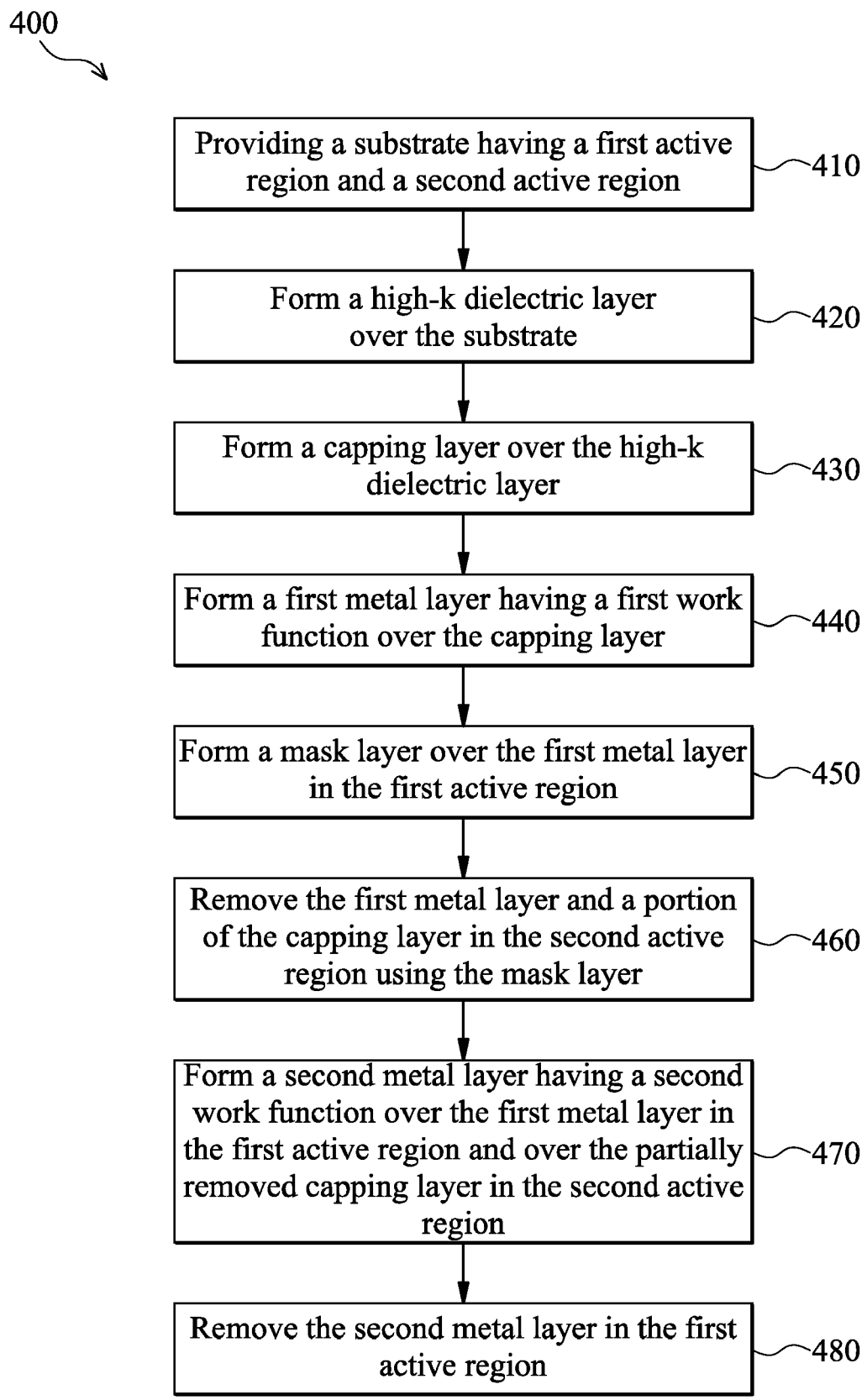
FIG. 4 is a flowchart illustrating an alternative method for fabricating a semiconductor device in a gate first process according to various aspects of the present disclosure.

Referring now to FIG. 4, illustrated is a flowchart of an alternative method 400 for fabricating a semiconductor device in a gate first process according to various aspects of the present disclosure. Referring also to FIGS. 5A to 5D, illustrated are cross-sectional views of a semiconductor at various stages of fabrication according to the method 400 of FIG. 4. It is understood that part of the semiconductor device 500 may be fabricated with normal CMOS technology processes, and thus some processes are only briefly described herein. Also, the semiconductor device 500 is similar to the semiconductor device 300 of FIG. 3 except for the differences discussed below. Accordingly, similar features in FIGS. 3 and 5 are numbered the same for the sake of simplicity and clarity.

Figure 5A:
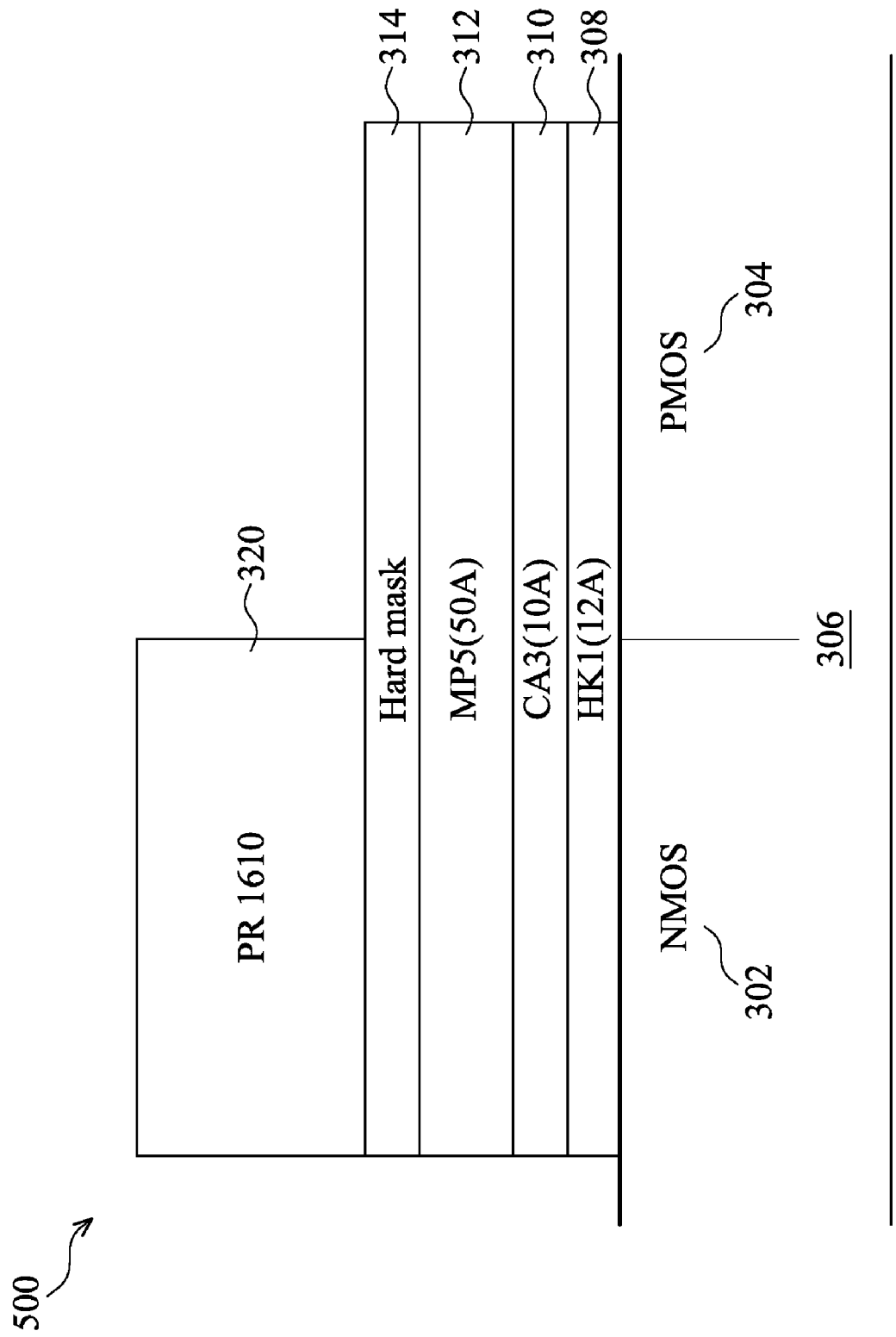
FIGS. 5A to 5D are cross-sectional views of a semiconductor device at various stages of fabrication according to the method of FIG. 4.

The method 400 begins with block 410 in which a semiconductor substrate having a first active region and a second active region may be provided. In FIG. 5A, the semiconductor device 500 may include a region 302 for an NMOS device and a region 304 for a PMOS device. The semiconductor device 500 may include a semiconductor substrate 306 such as a silicon substrate.

The method 400 continues with block 420 in which a high-k dielectric layer may be formed over the semiconductor substrate. The semiconductor device 500 may further include an interfacial layer (not shown) formed over the substrate 306. The interfacial layer may include a silicon oxide layer having a thickness ranging from about 5 to about 10 angstrom (A). The semiconductor device 300 may further include a high-k dielectric layer 308 formed on the interfacial layer. The high-k dielectric layer 308 may be formed by atomic layer deposition (ALD) or other suitable technique. The high-k dielectric layer 308 may include a thickness ranging from about 10 to about 30 angstrom (A).

The method 400 continues with block 430 in which a capping layer may be formed over the high-k dielectric layer. The semiconductor device 500 may further include a capping layer for tuning a work function of a metal layer (for the gate electrode) for properly performing as an NMOS transistor device 302 and a PMOS transistor device 304, respectively. For example, a capping layer 310 such as lanthanum oxide may be formed on the high-k dielectric layer 308 by deposition or other suitable process. The capping layer 310 may include a thickness ranging from about 3 to about 20 angstrom (A).

The method 400 continues with block 440 in which a first metal layer having a first work function may be formed over the capping layer. The semiconductor device 500 may further include a metal layer 312 formed over the capping layer 310. The metal layer 312 may have a first work function such as an N work function metal (N-metal). For example, the metal layer 312 may include TiN having a thickness ranging from about 10 to about 200 angstrom (A). The TiN metal layer/lanthanum oxide capping layer may perform with an effective work function of an N-metal. The metal layer 312 may be formed by various deposition techniques such as chemical vapor deposition (CVD), physical vapor deposition (PVD or sputtering), plating, or other suitable technique. Alternatively, the metal layer 312 may optionally include TaN, $ZrSi_2$, $MoSi_2$, $TaSi_2$, $NiSi_2$, WN, or other suitable material.

The method 400 continues with block 450 in which a mask layer may be formed over the first metal layer in the first active region. The semiconductor device 500 may further include a hard mask 314 formed over the metal layer 312. The hard mask 314 may be formed by a deposition process or other suitable process. The hard mask 314 may include silicon nitride, silicon oxynitride, silicon carbide, or other suitable material. A patterned photoresist layer 320 may be formed by a photolithography process for N/P patterning. The photolithography process may include spin coating, soft-baking, exposure, post-baking, developing, rinsing, drying, and other suitable process. Alternatively, the patterning may be performed by immersion lithography, electron beam lithography, or other suitable process. The patterned photoresist layer 320 may protect the various layers in the NMOS device 302.

Figure 5B:
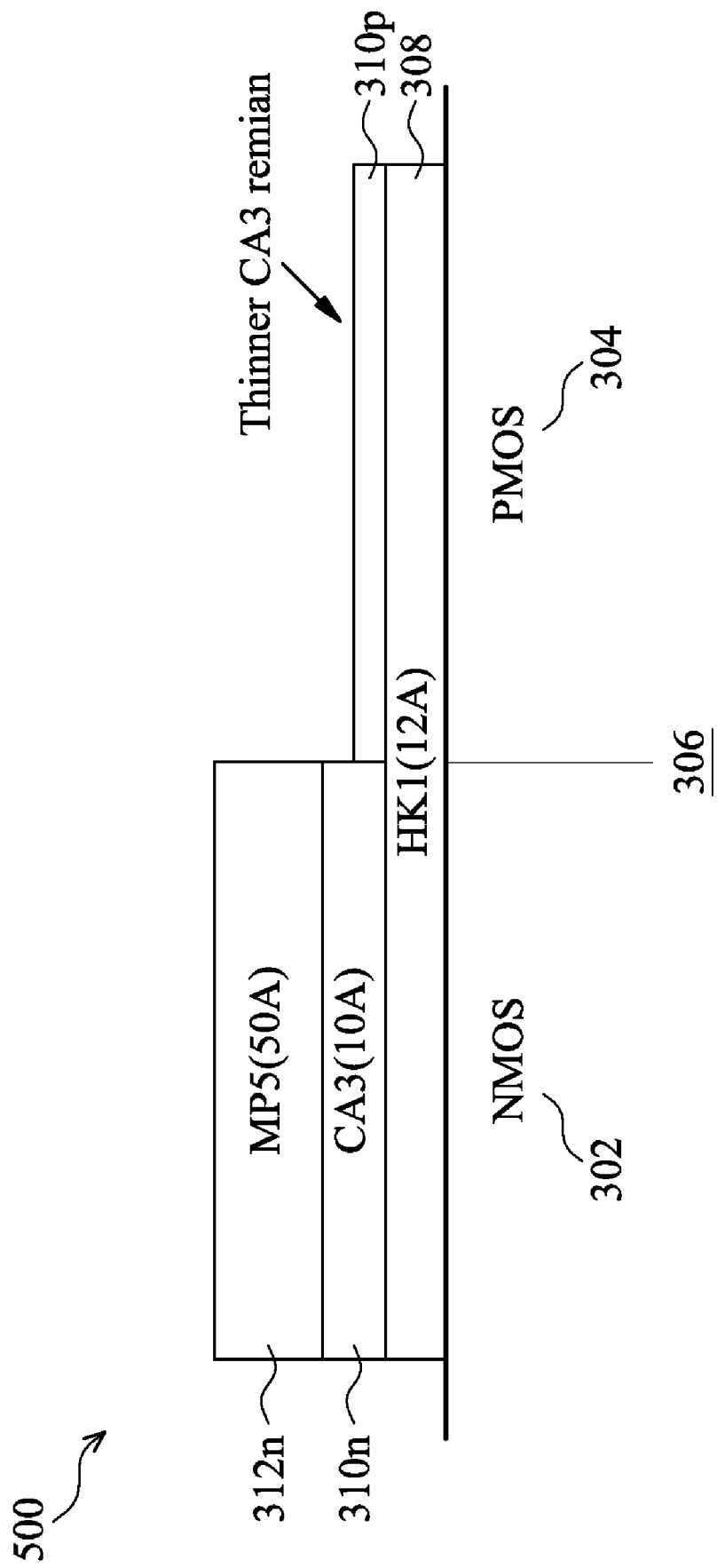

The method 400 continues with block 460 in which the first metal layer and a portion of the capping layer in the second active region may be removed using the mask layer. In FIG. 5B, a wet chemical etch may performed to remove the unprotected portion of the hard mask 314. The wet chemical etch may have a high selectivity such that the etch process may stop at the capping layer 310. Another wet chemical etch may be performed to remove a portion of the capping layer 310 in the PMOS region 304. Accordingly, a thinner capping layer 310p may remain in the PMOS device, and a metal layer 312n and capping layer 310n (tuning the metal layer to perform as N-metal) may remain in the NMOS device 302. The patterned photoresist layer 320 and hard mask 314 may be removed by stripping or other suitable process. It should be noted that the thinner capping layer 310p in the PMOS region 304 does not effect the work function in the PMOS device. In other words, an effective work function of a subsequent P-metal layer (gate electrode) formed over the thinner capping layer 310p is not adjusted and thus properly performs for the PMOS device.

Figure 5C:
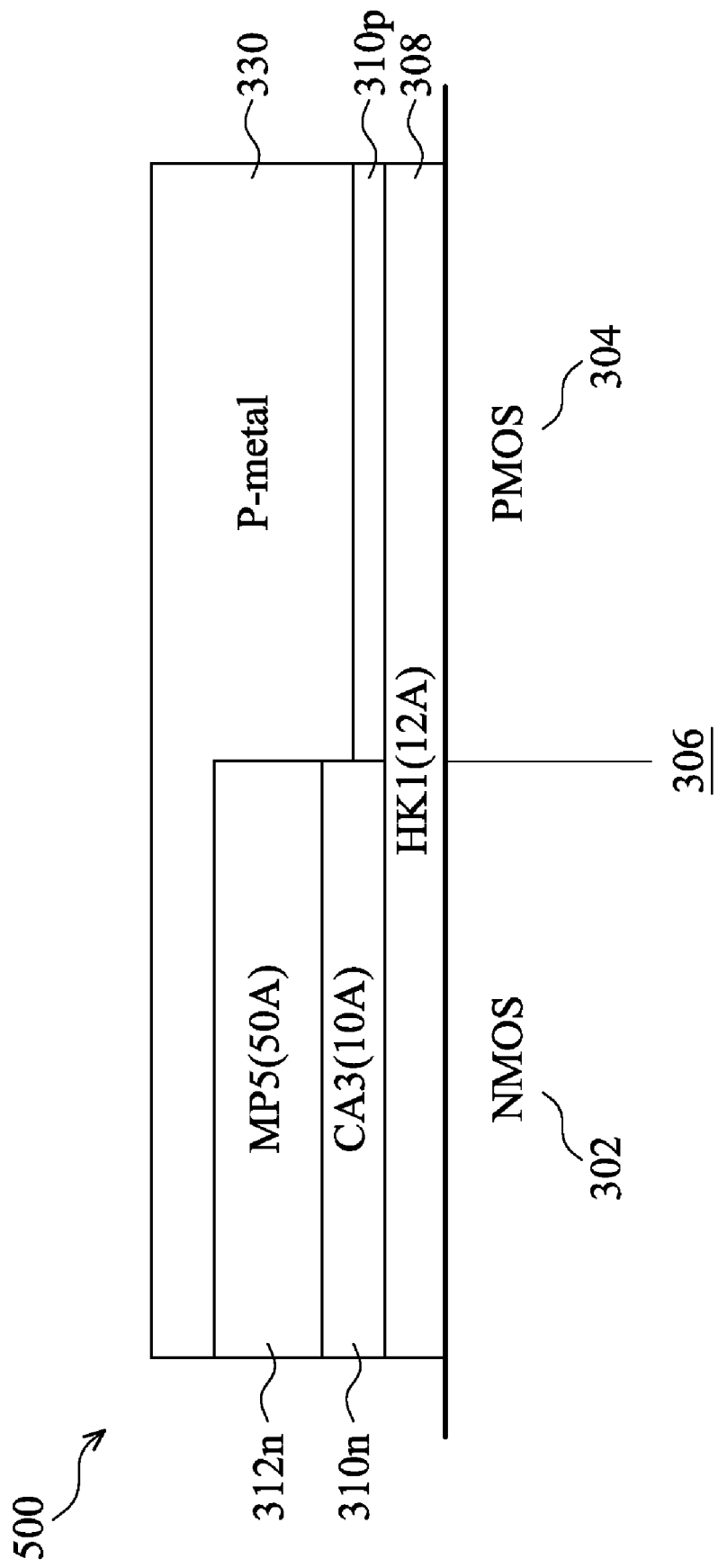
Figure 5D:
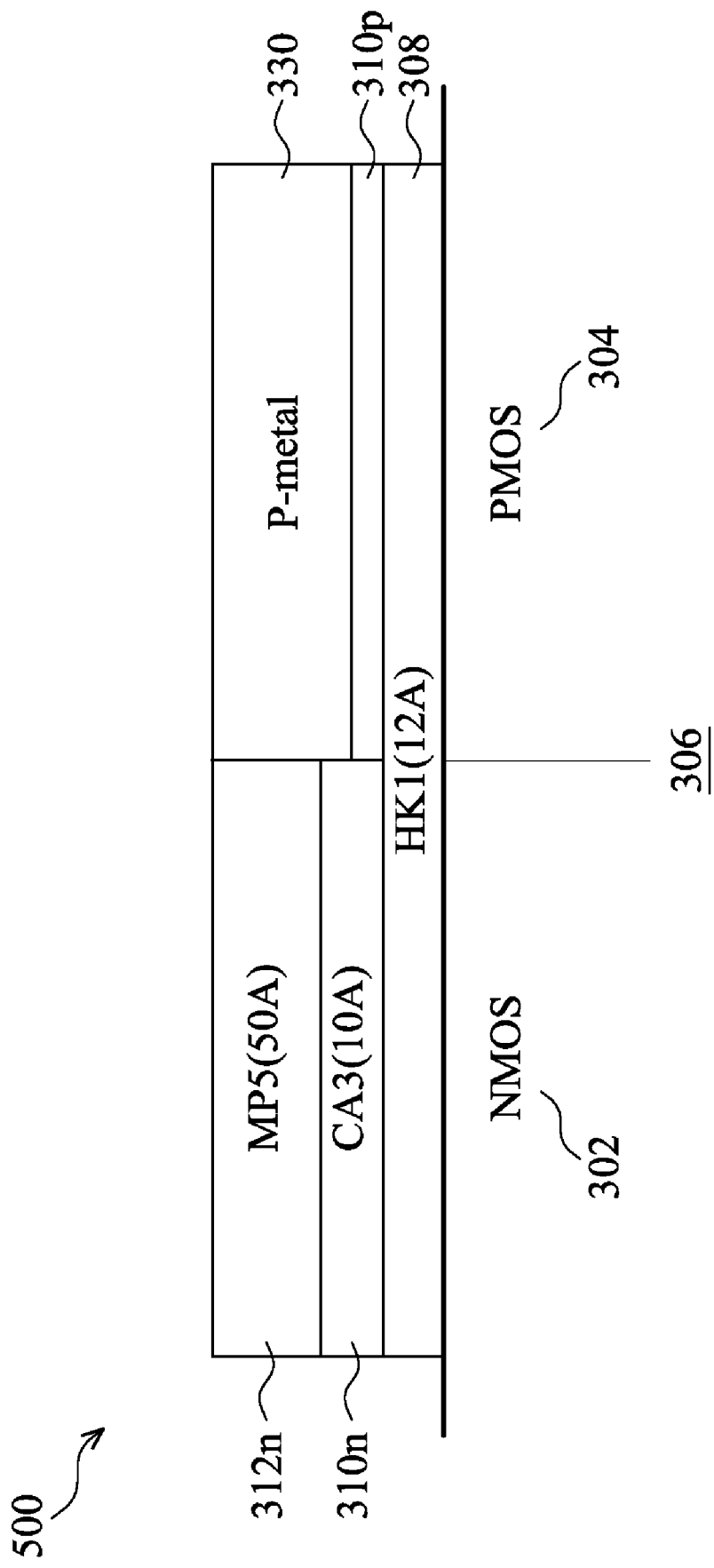

The method 400 continues with block 470 in which a second metal layer having a second work function may be formed on the first metal layer in the first active region and on the partially removed capping layer in the second active region. In FIG. 5C, a metal layer 330 having a P-metal work function (P-metal) may be deposited on the metal layer 312n in the NMOS device 302, and on the high-k dielectric layer 308 in the PMOS device 304. The metal layer 330 may include TiN and WN, or other suitable metal with a P work function. The method 400 continues with block 480 in which the second metal layer may be removed in the first active region. In FIG. 5D, an etch back process or chemical mechanical polishing (CMP) may be performed on the metal layer 330 to form a dual metal gate structure for the NMOS device 302 and PMOS 304 device, respectively. The semiconductor device 500 may undergo standard CMOS process flow to complete fabrication of the semiconductor device.

Referring now to FIGS. 6A through 6D, illustrated are cross-sectional views of a semiconductor device undergoing N/P patterning flow with different types of hard masks. The semiconductor devices illustrated in FIGS. 6A to 6D are similar to the semiconductor device 300 of FIG. 3 except for the differences discussed below. Accordingly, similar features in FIGS. 3 and 6 are numbered the same for the sake of simplicity and clarity.

Figure 6A:
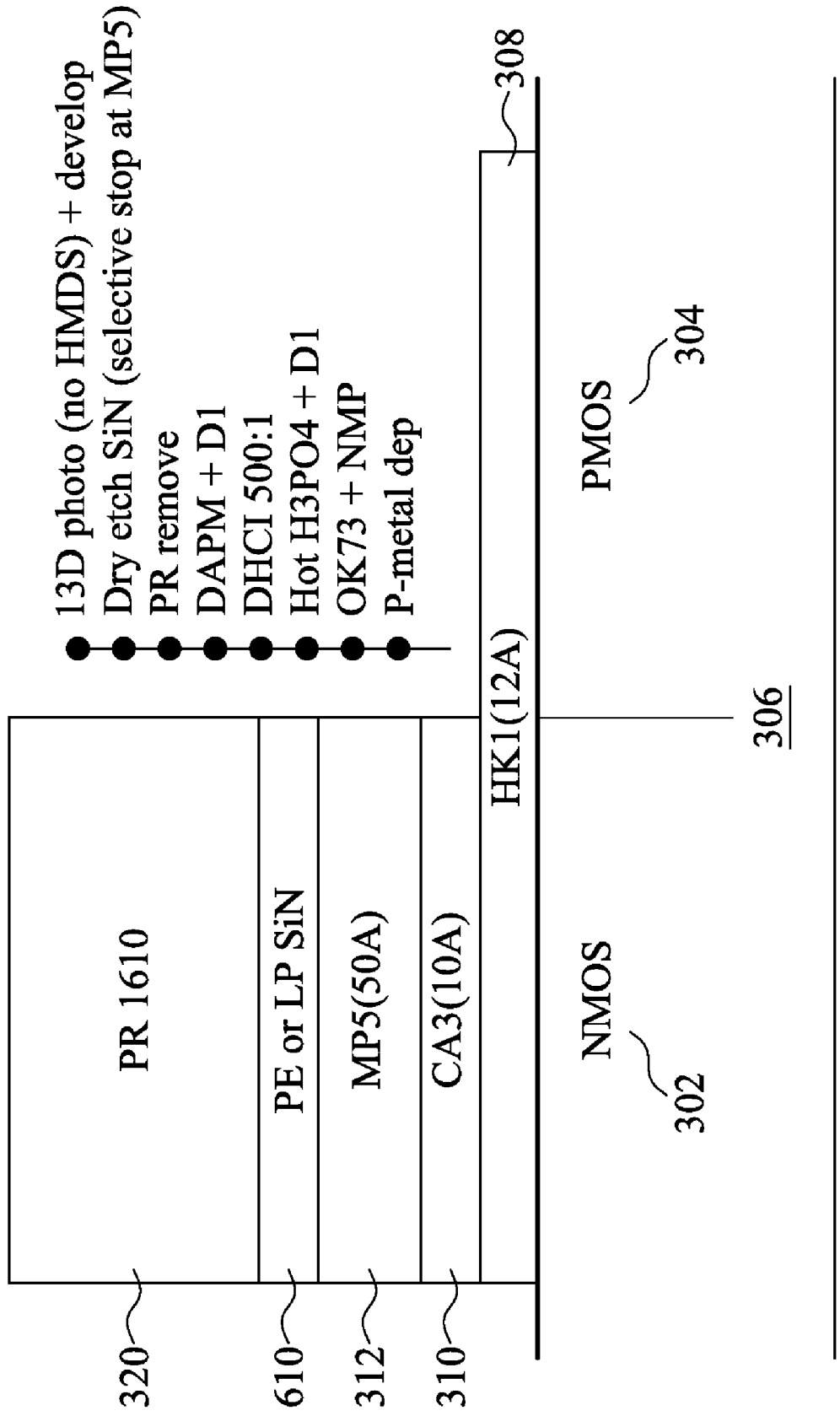
FIGS. 6A to 6D are cross-sectional views of a semiconductor is a flowchart illustrating another alternative method for fabricating a semiconductor device according to various aspects of the present disclosure.

In FIG. 6A, a hard mask 610 may include a silicon nitride (SiN). Following patterning a photoresist layer, the hard mask 610 may be patterned by a dry etch process and selectively stops at the metal layer 312. For example, the dry etch process may include $CF_4$, $CHF_3$, $CH_2F_2$, $SF_6$, or other suitable chemical. The patterned photoresist 320 may then be removed by a suitable process. The metal layer 312 and capping layer 310 in the PMOS device 304 may be removed by an etch process that includes DAPM+deionized water (DI) and DHCl with a ratio of 500:1. The hard mask 610 may be stripped with hot $H_3PO_4$+DI. Thereafter, various metal layers may be deposited to complete the metal gates of the NMOS device 302 and PMOS device 304, respectively.

Figure 6B:
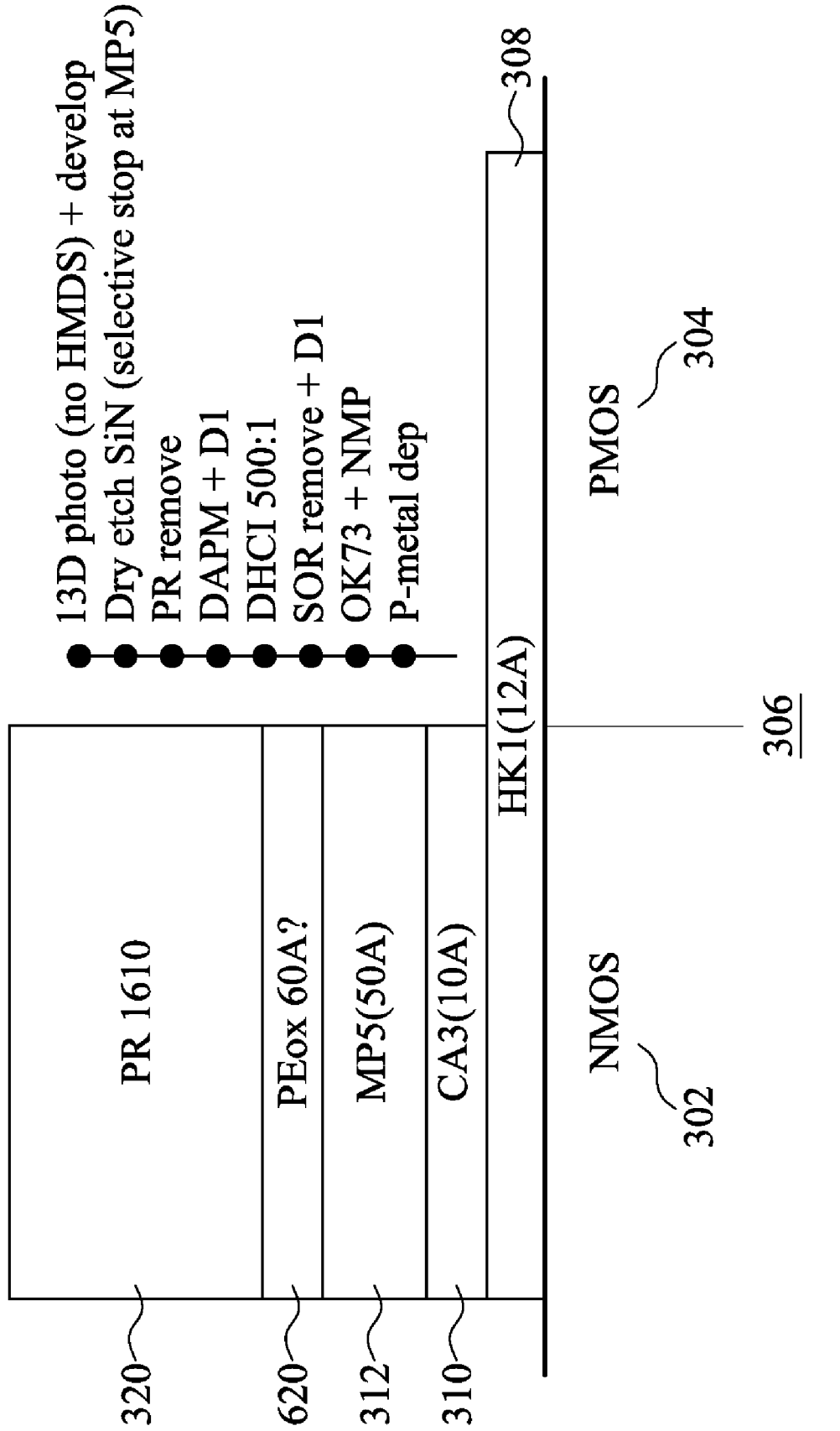

In FIG. 6B, a hard mask 620 may include an oxide such as a plasma enhanced oxide layer (PEOX). Following patterning a photoresist layer, the hard mask 620 may be patterned by a dry etch process and selectively stops at the metal layer 312. For example, the dry etch process may include $CF_4$, $O_2$, $SF_6$, or other suitable chemical. The patterned photoresist 320 may then be removed by a suitable process. The metal layer 312 and capping layer 310 in the PMOS device 304 may be removed by an etch process that includes DAPM+deionized water (DI) and DHCl with a ratio of 500:1. The hard mask 620 may be stripped with SOR+DI. Thereafter, various metal layers may be deposited to complete the metal gates of the NMOS device 302 and PMOS device 304, respectively.

Figure 6C:
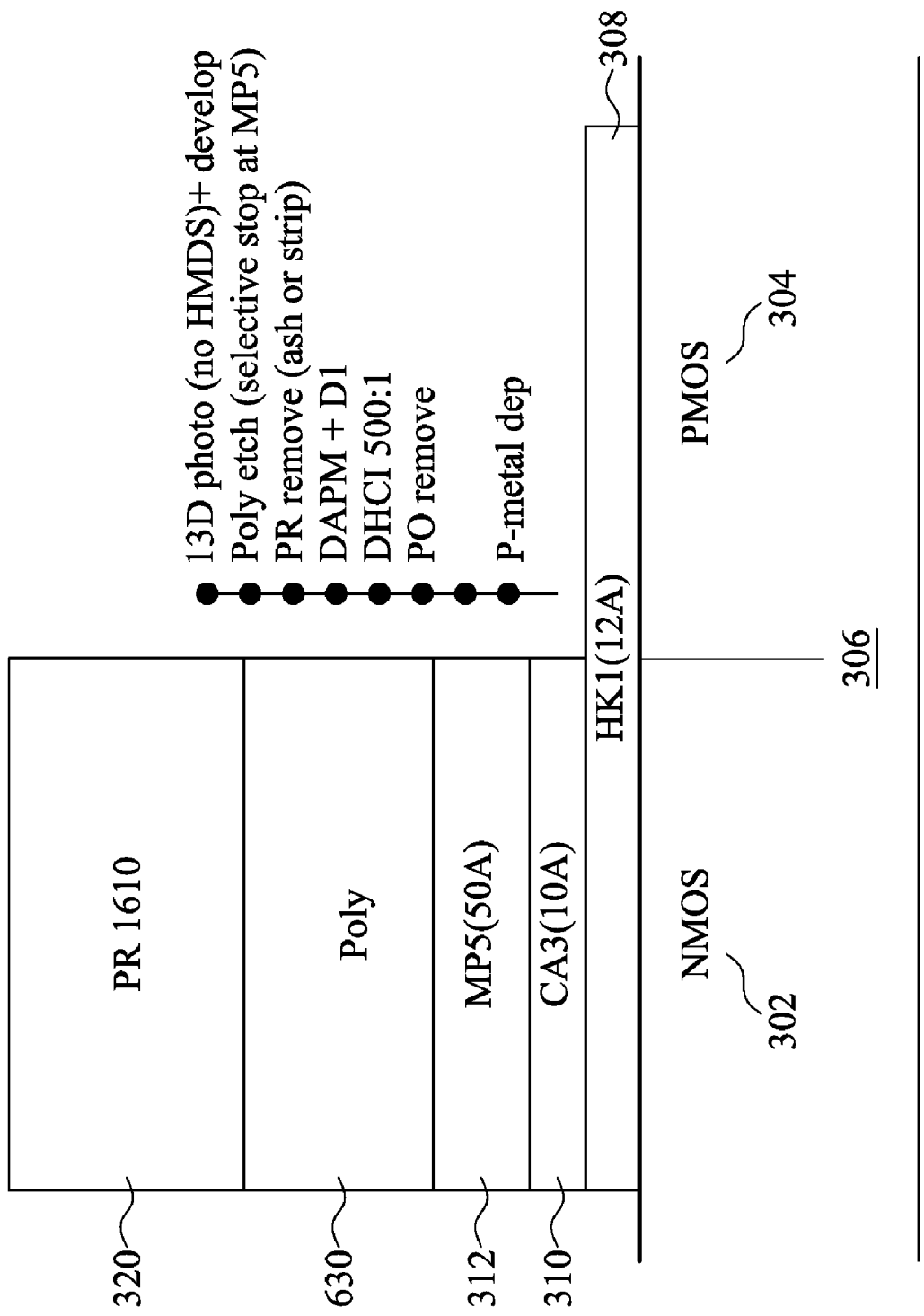

In FIG. 6C, a hard mask 630 may include a polysilicon or poly layer. Following patterning a photoresist layer, the hard mask 630 may be patterned by a dry etch process and selectively stops at the metal layer 312. For example, the dry etch process may include $CF_4$, $SF_6$, HBr, $Cl_2$, or other suitable chemical. The patterned photoresist 320 may then be removed by an ash or strip process. The metal layer 312 and capping layer 310 in the PMOS device 304 may be removed by an etch process that includes DAPM+deionized water (DI) and DHCl with a ratio of 500:1. The hard mask 630 may be removed or stripped by a wet etch process. Thereafter, various metal layers may be deposited to complete the metal gates of the NMOS device 302 and PMOS device 304, respectively.

Figure 6D:
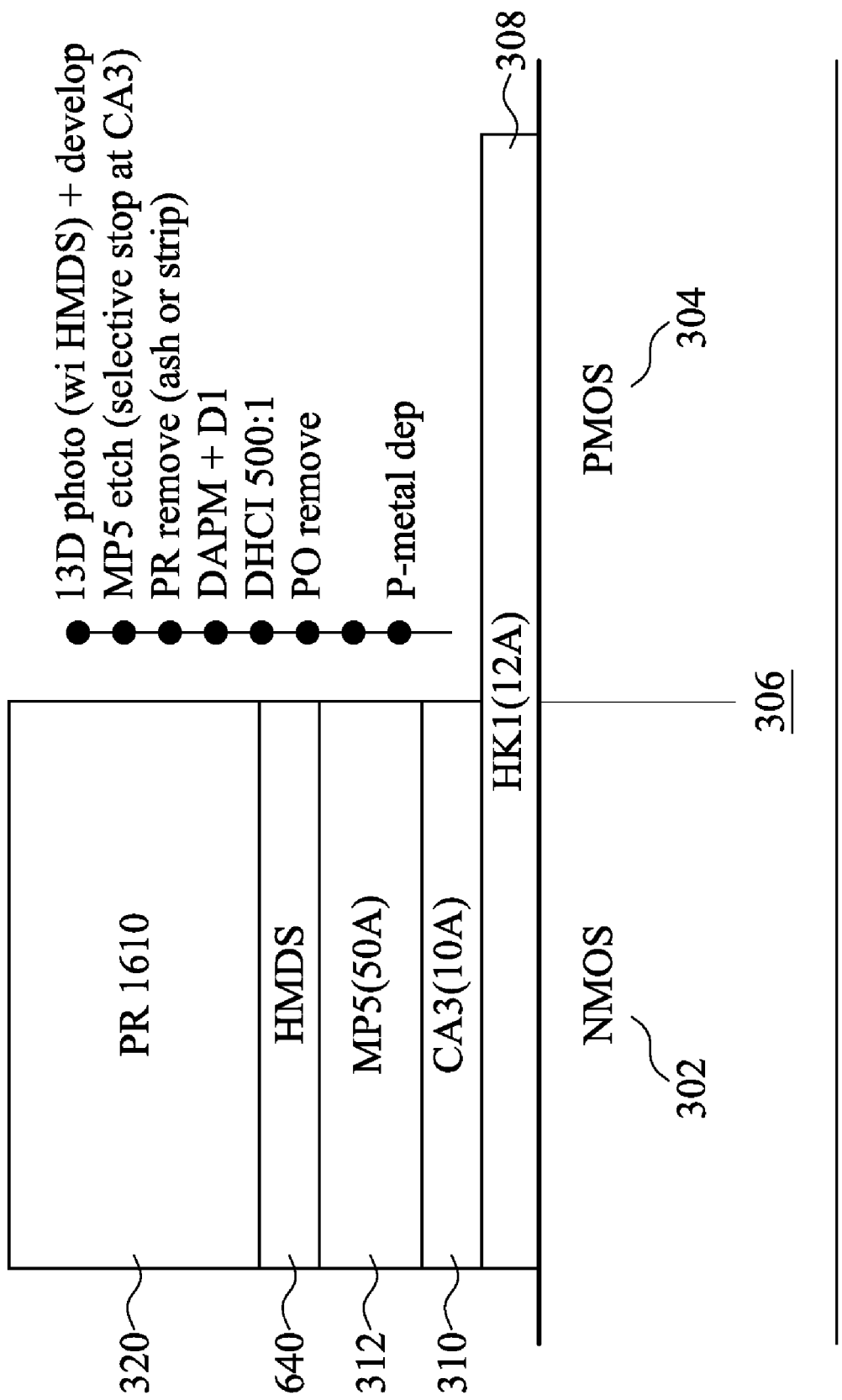

In FIG. 6D, a hard mask 640 may include an HMDS layer. Following patterning a photoresist layer, the hard mask 640 may be patterned by a dry etch process and selectively stops at the capping layer 310. For example, the dry etch process may include $O_2$, $N_2$, HBr, or other suitable chemical. The patterned photoresist 320 may then be removed by an ash or strip process. The metal layer 312 and capping layer 310 in the PMOS device 304 may be removed by an etch process that includes DAPM+deionized water (DI) and DHCl with a ratio of 500:1. The hard mask 640 may be removed or stripped with by a wet etch process. Thereafter, various metal layers may be deposited to complete the metal gates of the NMOS device 302 and PMOS device 304, respectively.

In FIGS. 6A-6D, the hard masks may be used to pattern the N-metal and capping in the NMOS device 302 in a gate first process. After the patterning, a P-metal may be formed in the PMOS device 304 in a gate first process as was discussed in FIGS. 2-5. Alternatively, a metal stop layer, such as TiN, may be formed over the N-metal in the NMOS device 302 and over the high-k dielectric in the PMOS device 304, and then a poly layer may be formed over the metal stop layer. A normal CMOS process flow may be performed to form various features (e.g., gate stacks, LDD regions, sidewall spacers, source/drain regions, etc.) until deposition of an interlayer dielectric (ILD) over the devices. A CMP process may be performed on the ILD to expose the poly layer, and an etch back process may be performed to remove the poly layer (forming trenches in the gate stack) using the underlying metal stop layer as an etch stop. Thereafter, a P-metal may be deposited in the trenches (gate) as well as a filler metal to complete the dual metal gate structure of the NMOS device and PMOS device. Accordingly, the N-metal for the NMOS device may be formed in a gate first process and the P-metal for the PMOS device may formed in a gate last process. The N-metal and capping layer in the NMOS device may be subjected to higher thermal processing (as compared to the P-metal in the PMOS device) without serious performance degradation, and thus may be formed in the gate first process.

Figure 7:
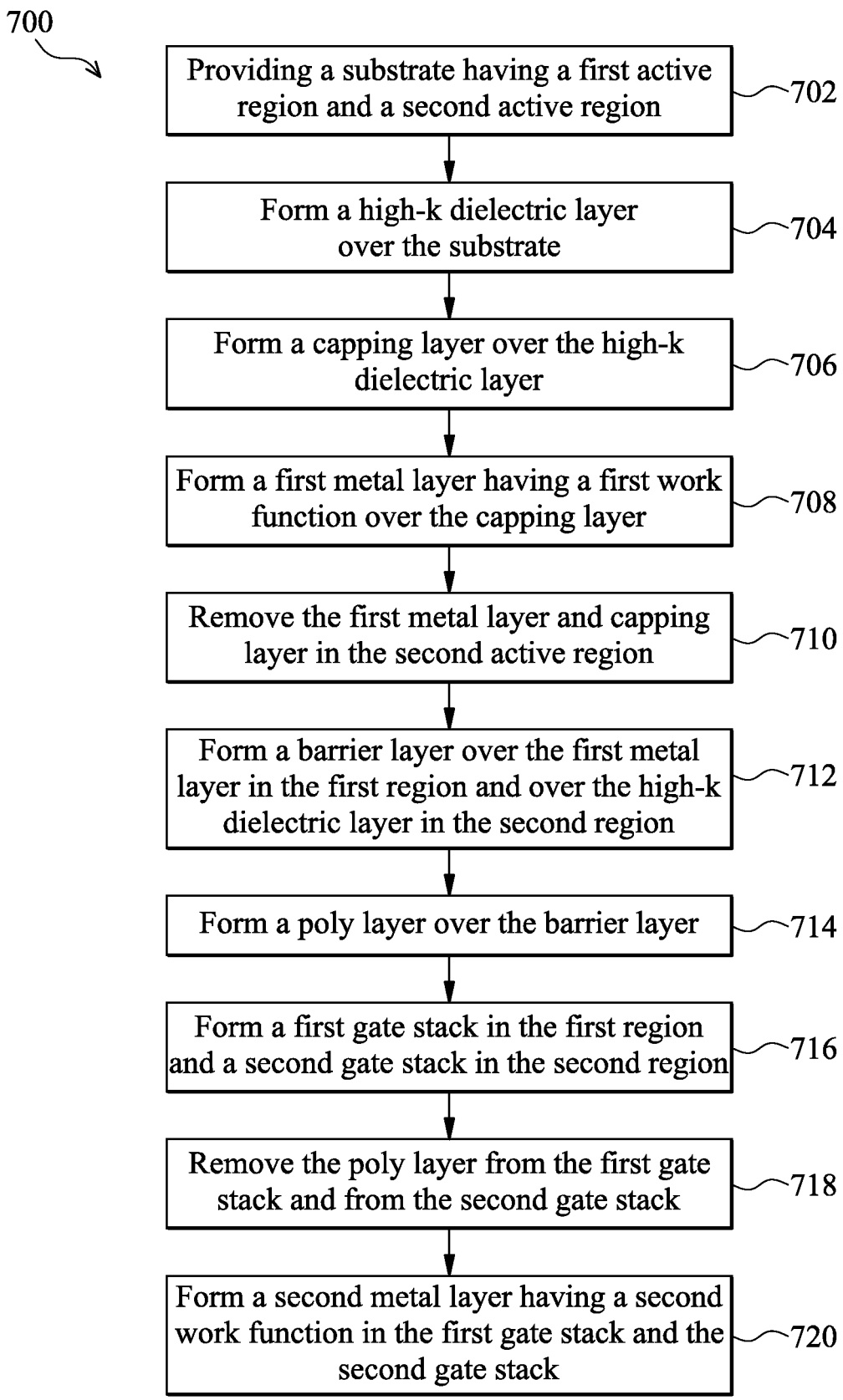
FIG. 7 is a flowchart illustrating a method for fabricating a semiconductor device in a hybrid process including a gate first process and a gate last process according to various aspects of the present disclosure.

Referring now to FIG. 7, illustrated is a flowchart of a method 700 for fabricating a semiconductor device in a hybrid gate process including a gate first process and a gate last process according to various aspects of the present disclosure. In the gate first process, a true metal gate structure may be formed first and may be followed by normal CMOS process flow to fabricate the final device (as discussed in FIGS. 2-6). In the gate last process, a dummy poly gate structure may be formed first and may be followed normal CMOS process flow until deposition of an interlayer dielectric (ILD), and thereafter the dummy poly gate structure may be removed and replaced with a true metal gate structure. In the hybrid gate process, the metal gate for an N-type MOS (NMOS) device may be formed first and the metal gate for a P-type (PMOS) device may be formed last as discussed below. Further, the metal gate for an PMOS device may be formed first and the metal gate for the NMOS may be formed last.

Referring also to FIGS. 8A to 8F, illustrated are cross-sectional views of a semiconductor device 900 at various stages of fabrication according to the method 700 of FIG. 7. It is understood that FIGS. 8A to 8F are simplified for a better understanding of the disclosed embodiments. For example, it is understood that part of the semiconductor device 900 may be fabricated with normal CMOS technology processing, and thus some processes are only briefly described herein.

Figure 8A:
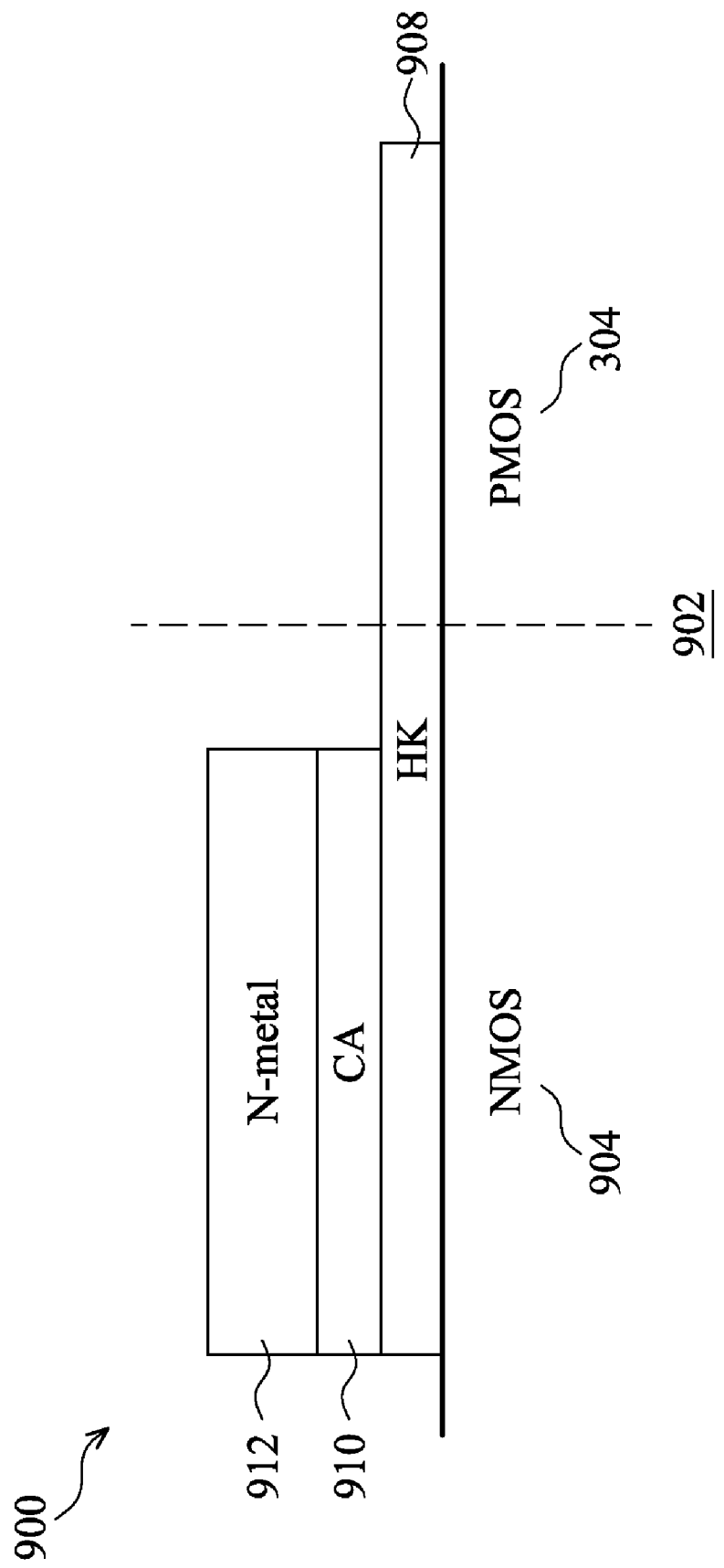
FIGS. 8A to 8F are cross-sectional views of a semiconductor device at various stages of fabrication according to the method of FIG. 7.

The method 700 begins with block 702 in which a semiconductor substrate having a first active region and a second active region may be provided. In FIG. 8A, the semiconductor device 900 may include a semiconductor substrate 902 such as a silicon substrate. The substrate 902 may alternatively include silicon germanium, gallium arsenic, or other suitable semiconductor materials. The substrate 902 may further include other features such as various doped regions, a buried layer, and/or an epitaxy layer. Furthermore, the substrate 902 may be a semiconductor on insulator such as silicon on insulator (SOI). In other embodiments, the semiconductor substrate 902 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 900 may further include an isolation structure (not shown) such as a shallow trench isolation (STI) feature formed in the substrate 902 for isolating active regions 904 and 906 in the substrate. The isolation structure may be formed of silicon oxide, silicon nitride, silicon oxynitride, fluoride-doped silicate (FSG), and/or a low k dielectric material known in the art. The active region 904 may be configured for an N-type metal-oxide-semiconductor transistor device (referred to as NMOS) and the active region 906 may be configured for a P-type MOS transistor device (referred to as PMOS).

The semiconductor device 900 may further include an interfacial layer (not shown) formed over the substrate 902. The interfacial layer may include a silicon oxide layer having a thickness ranging from about 5 to about 10 angstrom (A). The method 700 continues with block 704 in which a high-k dielectric layer may be formed over the semiconductor substrate. The semiconductor device 900 may further include a high-k dielectric layer 108 formed on the interfacial layer. The high-k dielectric layer 908 may be formed by atomic layer deposition (ALD) or other suitable technique. The high-k dielectric layer 908 may include a thickness ranging from about 10 to about 30 angstrom (A). The high-k dielectric layer 908 may include hafnium oxide ($HfO_2$). Alternatively, the high-k dielectric layer 908 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 700 continues with block 706 in which a capping layer may be formed over the high-k dielectric layer. The semiconductor device 900 may further include a capping layer for tuning a work function of a metal layer (for the gate electrode) for properly performing as an NMOS transistor device 904 and a PMOS transistor device 906, respectively. For example, a capping layer 910 such as lanthanum oxide may be formed in the NMOS region 904 as discussed in FIGS. 2 and 3. Alternatively, the capping layer 910 may optionally include LaSiO or other suitable material. The capping layer 910 may include a thickness ranging from about 3 to about 20 angstrom (A). It is understood that a different capping layer may be implemented in the PMOS device 906.

The method 700 continues with block 708 in which a first metal layer having a first work function may be formed over the capping layer. The semiconductor device 900 may further include a metal layer 912 formed over the high-k dielectric layer 908. The metal layer 912 may have a first work function such as an N-work function metal (N-metal). For example, the metal layer 912 may include TiN having a thickness ranging from about 10 to about 200 angstrom (A), preferably 50 A. The TiN metal layer/lanthanum oxide capping layer may perform with an effective work function of an N-metal. The metal layer 912 may be formed by various deposition techniques such as chemical vapor deposition (CVD), physical vapor deposition (PVD or sputtering), plating, or other suitable technique. The method 710 continues with block 710 in which the first metal layer and the capping layer may be removed in the second active region. The metal layer 912 and capping layer 910 may be patterned so that it is removed in the PMOS region 906 as discussed above in FIGS. 2 to 5.

Figure 8B:
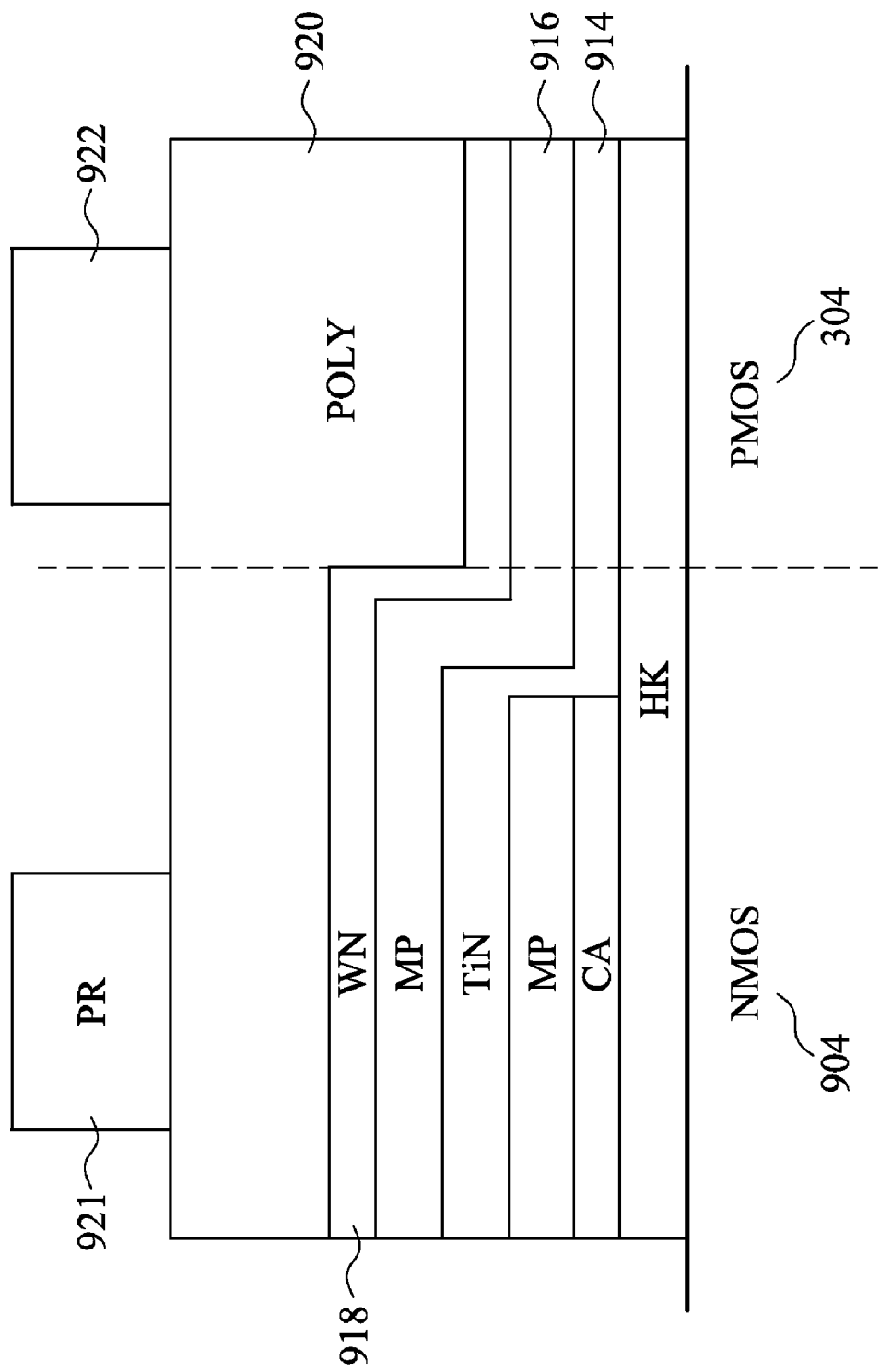

The method 700 continues with block 712 in which a barrier layer may be formed on the first metal layer in the first active region and on the high-k dielectric layer in the second active region. In FIG. 8B, the semiconductor device 900 may further include a barrier or stop metal layer 914 formed on the metal layer 912 in the NMOS device 904 and on the high-k dielectric layer 908 in the PMOS device 906. The barrier metal layer 914 may include TiN having a thickness of about 20 A or less. The semiconductor device 900 may further include a metal layer 916 formed over the barrier metal layer 914. The metal layer 916 may include TiN, TaN, $ZrSi_2$, $MoSi_2$, $TaSi_2$, $NiSi_2$, WN, or other suitable material. The semiconductor device 900 may further include a metal layer 918 formed over the metal layer 916. The metal layer 918 may include WN. The method 700 continues with block 714 in which a poly layer may be formed over the barrier layer. The semiconductor device 900 may further include a polysilicon (or poly) layer 920 formed over the metal layer 918 by a suitable deposition process. Alternatively, the poly layer 920 may be formed over the barrier metal layer 914, and the metal layers 916, 918 may be formed after removal of the poly layer 920 as discussed below in FIG. 9D.

A hard mask layer (not shown) may be formed over the poly layer 920. The hard mask layer may include SiN, SiON, SiC, SiOC/PEOX, TEOS, or other suitable material. Additionally, an anti-reflective coating or bottom anti-reflective coating (BARC) may be formed on the hard mask layer as is known in the art. A patterned photoresist layer may be formed with a gate pattern 921 for the NMOS device 904 and a gate pattern 922 for the PMOS device 906. The gate patterns 921, 922 may be formed by photolithography, immersion lithography, or other suitable process as was discussed above.

Figure 8C:
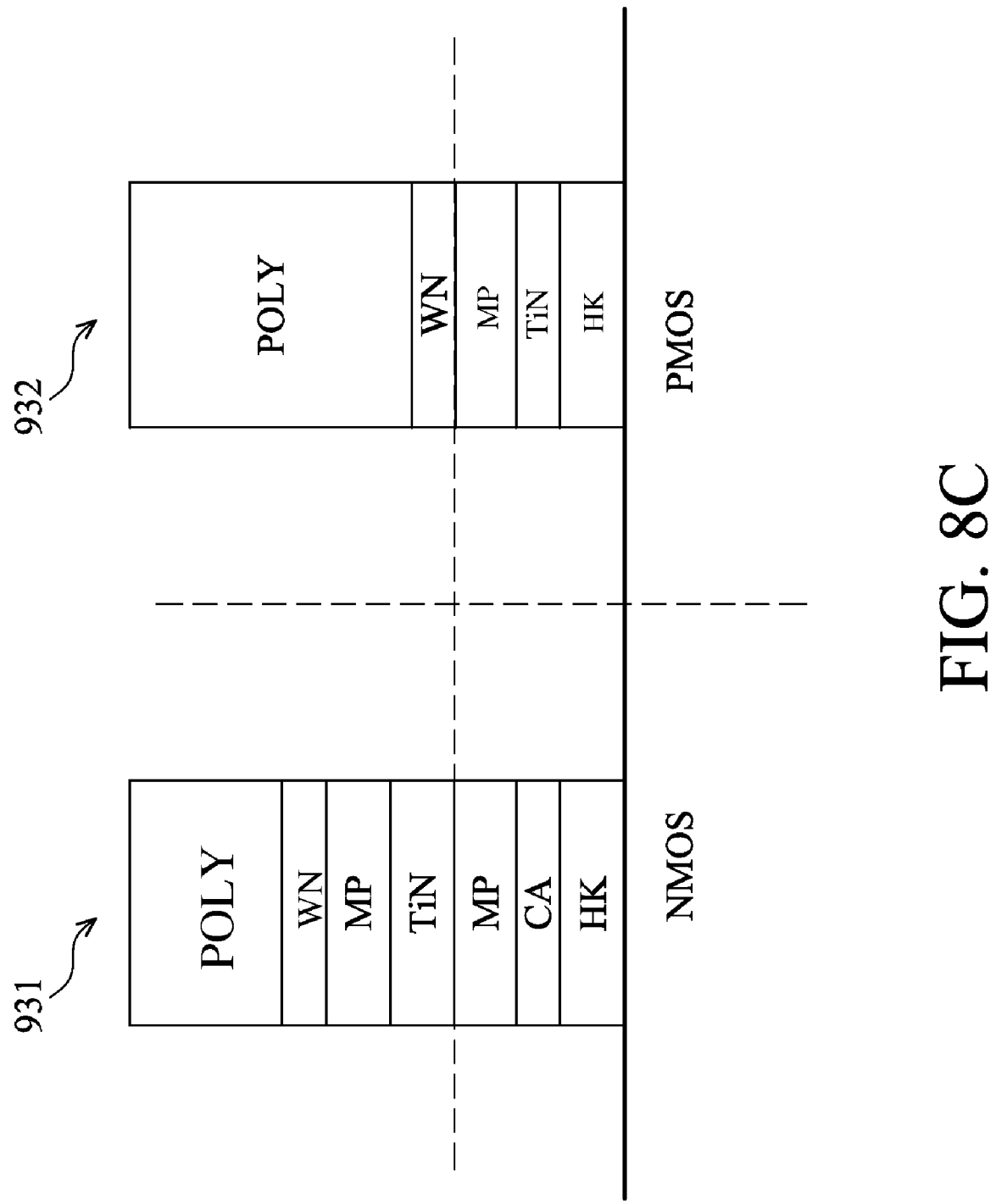

The method 700 continues with block 716 in which a first gate stack may be formed in the first active region and a second gate stack may be formed in the second active region. In FIG. 8C, the hard mask layer may be patterned by a dry or wet etching process using the gate patterns 921, 922, and the patterned hard mask layer may be used to pattern a gate stack 931 in the NMOS device 904 and a gate stack 932 in the PMOS device 906. The gate stacks 931, 932 may be formed by a dry or wet etching process (e.g., gate patterning). Thereafter, it is understood that the semiconductor device 900 may undergo normal CMOS process flow to form various features (e.g., lightly doped drain regions (LDD), sidewall spacers, source/drain regions, etc.) until deposition of an interlayer dielectric 940 over the entire substrate 902 including the devices 904, 906. A CMP process may be performed on the ILD layer 940 until the poly layer 920 of the gate stacks 931, 932 is exposed.

Figure 8D:
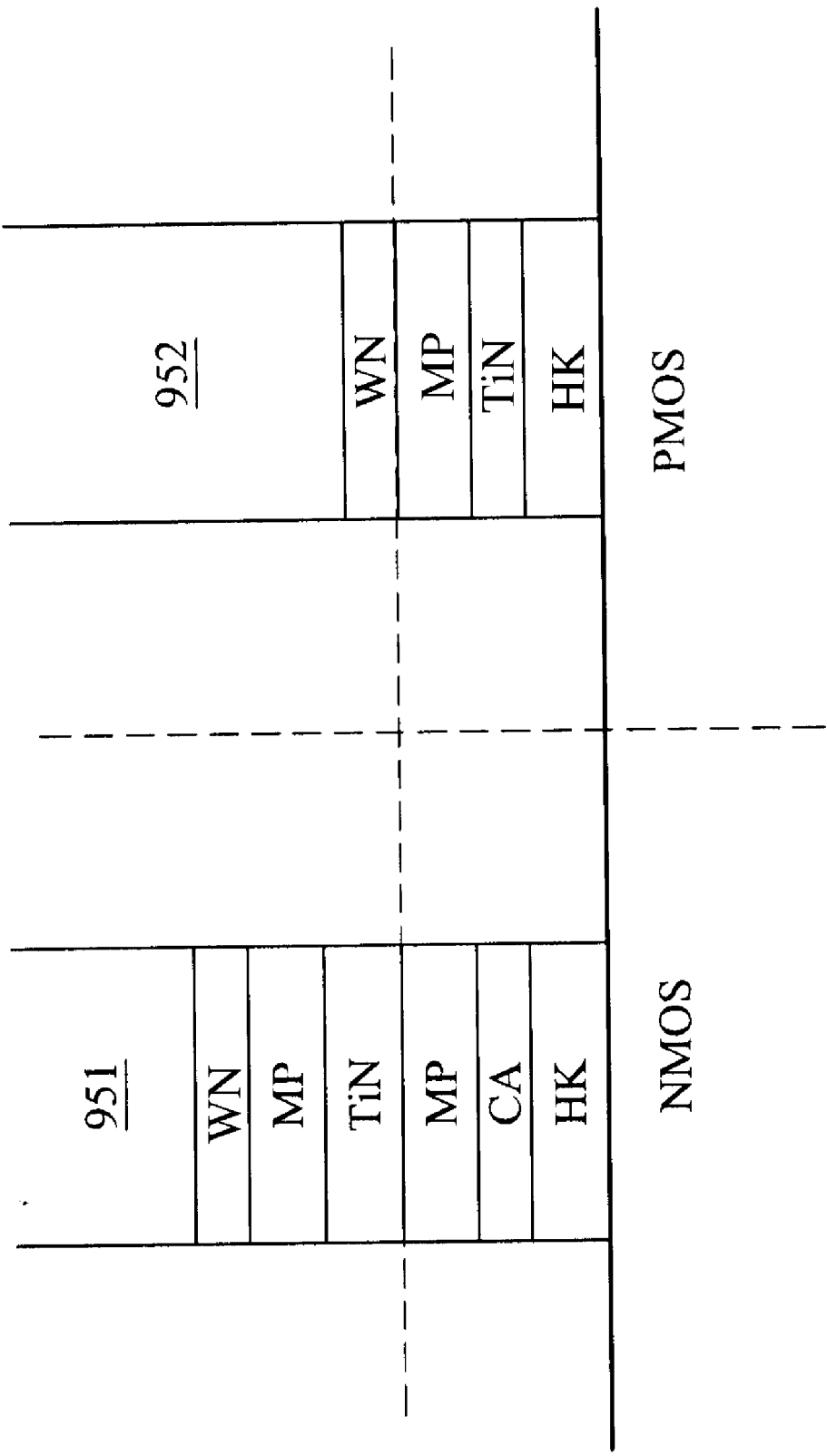

The method 700 continues with block 718 in which the poly layer may be removed from the first gate stack and from the second gate stack. In FIG. 8D, the poly layers 920 in the gate stacks 931, 932 may be removed by an etch back process and may stop at the metal layer 918. Accordingly, a trench 951 in the NMOS device 904 and a trench 952 in the PMOS device may be formed.

Figure 8E:
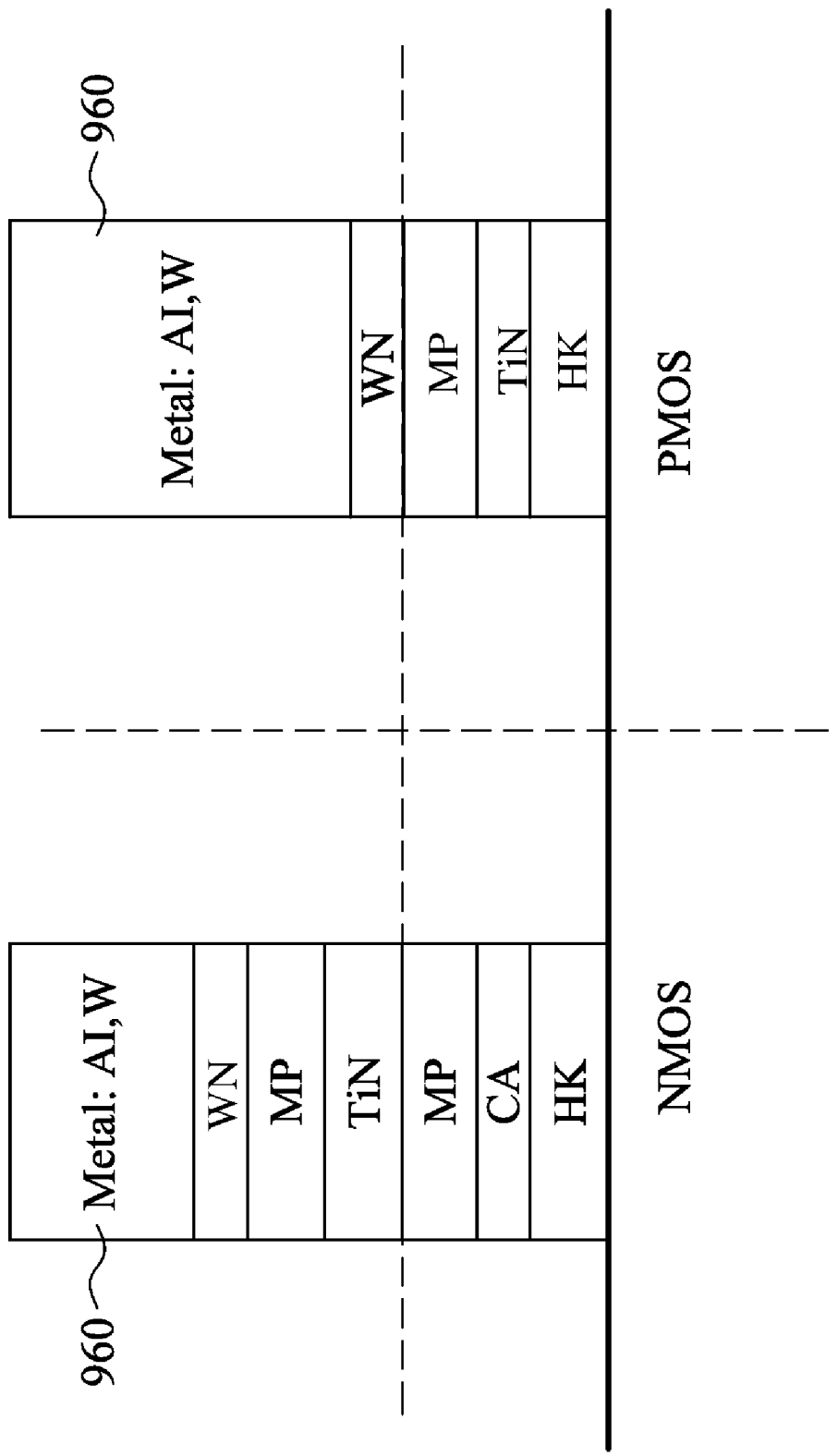

The method 700 continues with block 720 in which a second metal layer having a second work function may be formed in the first gate stack and the second gate stack. In FIG. 8E, a metal layer 960 may be deposited by CVD or other suitable deposition process filling in the trenches 951, 952. The metal layer 960 may include W, Al, or other suitable material. A metal CMP process may be performed on the metal layer 960 to planarize the metal gates in NMOS device 904 and PMOS device 906 for further processing. For example, various contacts/vias and multilayer interconnect features (e.g., metal layers and interlayer dielectric) may be formed and configured to connect the various features or structures of the semiconductor device 900.

Figure 8F:
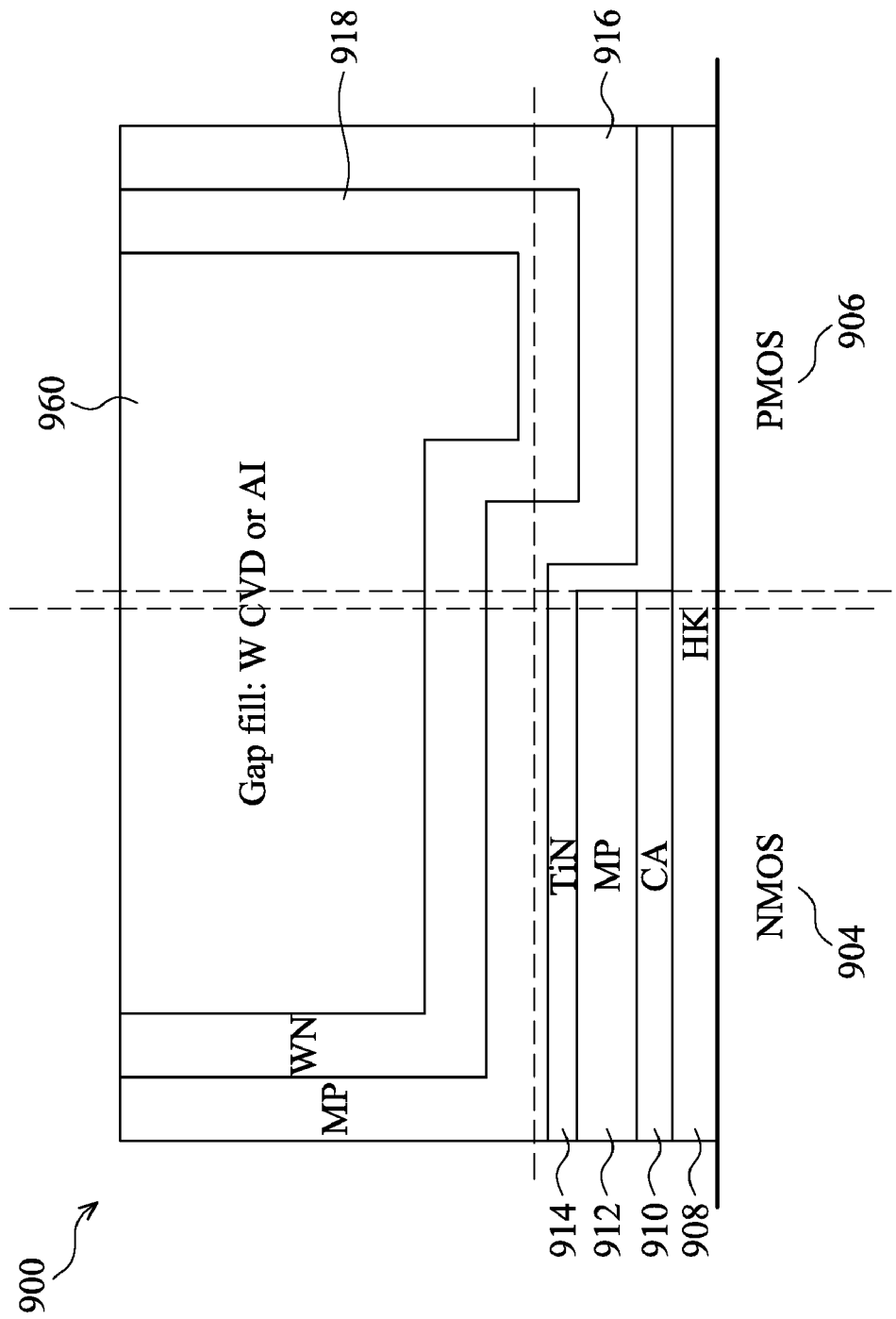

In FIG. 8F, illustrated is a more detailed conceptually view of the high-k/metal gate structures of NMOS device 904 and PMOS device 906. The NMOS device 904 and PMOS device 906 provide a dual metal gate structure that properly performs as an N work function metal and a P work function metal, respectively.

The present invention achieves different advantages in various embodiments disclosed herein. For example, the present disclosed method provides a simple and cost-effective method for high-k/metal gate patterning in a CMOS process flow. The methods and devices disclosed herein may be easily integrated with current CMP process flow and thus are applicable in future and advanced technologies. In some embodiments, the patterning process disclosed herein allows for better control of defects caused by photoresist residue, and control of the high-k gate profile. Also, the various hard masks disclosed herein for the N/P patterning for a gate first process are easy to catch since the etch process has a high selectivity to the high-k material and capping materials. In other embodiments, a hybrid process flow may be implemented to form a dual gate structure for an NMOS and PMOS device. The hybrid process may include a gate first process to form one of the metal gates (e.g., N-metal or P-metal) and a gate last process to form the other of the metal gates (e.g., P-metal or N-metal).

Thus, provided is a method for fabricating a semiconductor device that includes providing a semiconductor substrate having a first active region and a second active region, forming a high-k dielectric layer over the semiconductor substrate, forming a capping layer over the high-k dielectric layer, forming a first metal layer over the capping layer, the first metal layer having a first work function, forming a mask layer over the first metal layer in the first active region, removing the first metal layer and the capping layer in the second active region using the mask layer, and forming a second metal layer over the high-k dielectric layer in the second active region, the second metal layer having a second work function.

Also provided is another method of fabricating a semiconductor device that includes providing a semiconductor substrate having a first active region and a second active region, forming a high-k dielectric layer over the semiconductor substrate, forming a capping layer over the high-k dielectric layer, forming a first metal layer over the capping layer, the first metal layer having a first work function, forming a mask layer over the first metal layer in the first active region, removing the first metal layer and a portion of the capping layer in the second active region using the mask layer, and forming a second metal layer over the partially removed capping layer in the second active region, the second metal layer having a second work function.

Further, still another method of fabricating a semiconductor device that includes providing a semiconductor substrate having a first active region and a second active region, forming a high-k dielectric layer over the semiconductor substrate, forming a capping layer over the high-k dielectric layer, forming a first metal layer over the capping layer, the first metal layer having a first work function, removing the first metal layer and at least a portion of the capping layer in the second active region, forming a barrier layer over the first metal layer in the first active region and over the high-k dielectric layer in the second region, forming a poly layer over the barrier metal layer, forming a first gate stack in the first active region and a second gate stack in the second active region, removing the poly layer from the first gate stack and from the second gate stack, and forming a second metal layer having a second work function to replace the poly layer in the first gate stack and in the second gate stack.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device comprising:
    providing a semiconductor substrate having a first active region and a second active region;
    forming a high-k dielectric layer over the first active region and the second active region of the semiconductor substrate, the high-k dielectric layer having a lower surface facing the semiconductor substrate and an upper surface facing in a an opposite direction from the lower surface;
    depositing a capping layer on the upper surface of the high-k dielectric layer over the first active region and the second active region of the semiconductor substrate;
    forming a first metal layer over the capping layer, the first metal layer having a first work function;
    forming a mask layer over the first metal layer in the first active region;
    removing the first metal layer and the capping layer in the second active region using the mask layer; and
    forming a second metal layer over the high-k dielectric layer in the second active region, the second metal layer having a second work function.

2. The method of claim 1, wherein the forming the mask layer includes forming one of a silicon nitride layer, an oxide layer, a polysilicon layer, and an HMDS layer.

3. The method of claim 2, wherein the forming the mask layer includes performing an etch process that has high selectivity such that the etch process stops at the first metal layer.

4. The method of claim 1, wherein the capping layer includes one of a lanthanum oxide and LaSiO.

5. The method of claim 1, wherein the first work function includes an N work function metal and wherein the second work function includes a P work function metal.

6. The method of claim 1, wherein the forming the second metal layer includes:
    depositing the second metal layer on the first metal layer in the first active region and on the high-k dielectric layer in the second active region; and
    performing an etch back process or chemical mechanical polishing process on the second metal layer to remove the second metal layer in the first active region.

7. The method of claim 1, wherein the first active region includes an NMOS transistor device and wherein the second active region includes a PMOS transistor device.

8. A method of fabricating a semiconductor device comprising:
    providing a semiconductor substrate having a first active region and a second active region;
    forming a high-k dielectric layer over the semiconductor substrate;
    depositing a capping layer having a first thickness on the high-k dielectric layer;
    forming a first metal layer over the capping layer, the first metal layer having a first work function;
    forming a mask layer over the first metal layer in the first active region;
    removing the first metal layer and a portion of the capping layer to form a partially removed capping layer in the second active region using the mask layer, the partially removed capping layer having a second thickness, the second thickness being less than the first thickness; and
    forming a second metal layer on the partially removed capping layer in the second active region, the second metal layer having a second work function.

9. The method of claim 8, wherein the mask layer includes one of a silicon nitride, an oxide, a polysilicon, and a HMDS layer.

10. The method of claim 8, wherein the removing the first metal layer and a portion of the capping layer includes performing an etch process that has a high selectivity such that the etch process stops at the capping layer.

11. The method of claim 8, wherein the high-k dielectric layer includes one of a hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

12. The method of claim 8, further comprising, after forming the second metal layer, forming a first gate stack in the first active region and a second gate stack in the second region;
   wherein the first gate stack includes the first metal layer, the capping layer, and the high-k dielectric layer; and
   wherein the second gate stack includes the second metal layer, the partially removed capping layer, and the high-k dielectric layer.

13. A method of fabricating a semiconductor device comprising:
   providing a semiconductor substrate having a first active region and a second active region;
   forming a high-k dielectric layer over the semiconductor substrate;
   forming a capping layer over the high-k dielectric layer;
   forming a first metal layer over the capping layer, the first metal layer having a first work function;
   removing the first metal layer and at least a portion of the capping layer in the second active region;
   forming a barrier layer over the first metal layer in the first active region and over the high-k dielectric layer in the second region;
   forming a poly layer over the barrier metal layer;
   forming a first gate stack in the first active region and a second gate stack in the second active region;
   removing the poly layer from the first gate stack and from the second gate stack; and
   forming a second metal layer having a second work function to replace the poly layer in the first gate stack and in the second gate stack.

14. The method of claim 13, wherein the first work function includes an N work function metal and wherein the second work function includes a P work function metal.

15. The method of claim 13, wherein the removing the poly layer includes performing an etch back process that stops at the barrier layer, the etch back process creating a first trench in the first gate stack and a second trench in the second gate stack.

16. The method of claim 15, wherein the forming the second metal layer includes:
   depositing the second metal layer to fill in the first trench and the second trench; and
   performing a chemical mechanical polishing (CMP) process on the second metal layer to planarize the first gate stack and the second gate stack.

17. The method of claim 15, wherein the removing the first metal layer and at least a portion of the capping layer includes removing the entire capping layer in the second active region.

18. The method of claim 15, wherein the first metal layer includes one of TiN, TaN, $ZrSi_2$, $MoSi_2$, $TaSi_2$, $NiSi_2$, and WN.

19. The method of claim 15, wherein the second metal layer includes a multi-metal layer comprising TiN and WN.

20. The method of claim 1, further comprising performing a chemical mechanical polishing (CMP) process on the first and second metal layers such that an upper surface of the first metal layer is substantially coplanar with an upper surface of the second metal layer.

* * * * *